(12) United States Patent
Tak et al.

(10) Patent No.: US 11,231,541 B2
(45) Date of Patent: Jan. 25, 2022

(54) ELECTRONIC DEVICE

(71) Applicant: SAMSUNG DISPLAY CO., LTD., Yongin-si (KR)

(72) Inventors: Kyungseon Tak, Hwaseong-si (KR); Younggu Kim, Yongin-si (KR); Taekjoon Lee, Hwaseong-si (KR); Sun-Young Chang, Seoul (KR); Jin-Soo Jung, Hwaseong-si (KR); Jongmin Ok, Hwaseong-si (KR); Hyelim Jang, Hwaseong-si (KR); Baekkyun Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 23 days.

(21) Appl. No.: 16/432,205

(22) Filed: Jun. 5, 2019

(65) Prior Publication Data
US 2020/0081173 A1 Mar. 12, 2020

(30) Foreign Application Priority Data
Sep. 11, 2018 (KR) .......... 10-2018-0108387

(51) Int. Cl.
*F21V 8/00* (2006.01)
*G02F 1/13357* (2006.01)
*H01L 27/32* (2006.01)

(52) U.S. Cl.
CPC ....... *G02B 6/005* (2013.01); *G02F 1/133617* (2013.01); *H01L 27/322* (2013.01)

(58) Field of Classification Search
None
See application file for complete search history.

(56) References Cited

U.S. PATENT DOCUMENTS

| 8,950,924 B2 | 2/2015 | Wheatley et al. |
| 9,715,043 B2 | 7/2017 | Ogane |

(Continued)

FOREIGN PATENT DOCUMENTS

| CN | 109709710 | 5/2019 |
| EP | 3477369 | 5/2019 |

(Continued)

OTHER PUBLICATIONS

Examination Report dated Feb. 4, 2020 in corresponding Europeen Patent Application No. 19192988.4.

(Continued)

*Primary Examiner* — Richard H Kim
(74) *Attorney, Agent, or Firm* — F. Chau & Associates, LLC

(57) ABSTRACT

An electronic device includes a light source member configured to provide a first light, a color conversion member disposed on the light source member and including a first conversion material that converts the first light into a second light and a second conversion material that converts the first light into a third light, and a low-refractive index layer disposed on the light source member and disposed on at least one of upper and lower portions of the color conversion member. The low-refractive index layer includes a matrix part, a plurality of hollow inorganic particles dispersed in the matrix part, and a plurality of void parts defined by the matrix part.

33 Claims, 19 Drawing Sheets

(56) References Cited

U.S. PATENT DOCUMENTS

| | | | |
|---|---|---|---|
| 2015/0131311 A1* | 5/2015 | Wheatley | G02B 6/0051 |
| | | | 362/606 |
| 2015/0185381 A1* | 7/2015 | Wu | G02F 1/133617 |
| | | | 349/106 |
| 2017/0131439 A1* | 5/2017 | Kobori | C08J 7/044 |
| 2017/0131445 A1* | 5/2017 | Koyama | B32B 27/30 |
| 2017/0317246 A1* | 11/2017 | Kang | C09D 181/00 |
| 2019/0121176 A1 | 4/2019 | Lee et al. | |
| 2019/0219875 A1 | 7/2019 | Jung et al. | |

FOREIGN PATENT DOCUMENTS

| | | |
|---|---|---|
| JP | 2013-254093 | 12/2013 |
| JP | 5930897 | 6/2016 |
| KR | 10-0638827 | 10/2006 |
| KR | 10-1631670 | 6/2016 |
| WO | 2011071728 | 6/2011 |
| WO | 2012105597 | 8/2012 |

OTHER PUBLICATIONS

Examination report Dec. 1, 2020 from the European Patent Office in corresponding European Patent Application No. 19 192 988.4.

* cited by examiner

LRL DTP

LRL

ELECTRONIC DEVICE

CROSS-REFERENCE TO RELATED APPLICATIONS

This application claims priority under 35 U.S.C. § 119 to Korean Patent Application No. 10-2018-0108387, filed on Sep. 11, 2018, the disclosure of which is incorporated by reference herein in its entirety.

TECHNICAL FIELD

Exemplary embodiments of the present inventive concept relate to an electronic device, and more particularly, to an electronic device including a low-refractive index layer.

DISCUSSION OF THE RELATED ART

Various electronic devices for providing image information in multimedia devices such as televisions, mobile phones, tablet computers, navigation devices, game consoles, etc. are being developed. Particularly, in an electronic device including a liquid crystal display device, an organic electroluminescence display device, etc., quantum dots are being introduced to improve display quality.

To further improve light efficiency in the electronic device using the quantum dots, an optical member using a low-refractive index material is being used.

SUMMARY

Exemplary embodiments of the present inventive concept provide an electronic device including a low-refractive index layer which includes hollow inorganic particles and void parts, which may improve strength while providing good low-refractive properties.

Exemplary embodiments of the present inventive concept also provide an electronic device in which a low-refractive index layer having high strength is provided on a display member, which may improve reliability and optical characteristics.

According to an exemplary embodiment, an electronic device includes a light source member configured to provide a first light, a color conversion member disposed on the light source member and including a first conversion material that converts the first light into a second light and a second conversion material that converts the first light into a third light, and a low-refractive index layer disposed on the light source member and disposed on at least one of upper and lower portions of the color conversion member. The low-refractive index layer includes a matrix part, a plurality of hollow inorganic particles dispersed in the matrix part, and a plurality of void parts defined by the matrix part.

In an exemplary embodiment, each of the hollow inorganic particles includes a core part filled with air and a shell part surrounding the core part.

In an exemplary embodiment, the shell part includes at least one of $SiO_2$, $MgF_2$, or $Fe_3O_4$.

In an exemplary embodiment, the void parts have sphere shapes and a mean diameter of about 1 nm to about 5 nm.

In an exemplary embodiment, the hollow inorganic particles have sphere shapes and a mean diameter of about 20 nm to about 200 nm.

In an exemplary embodiment, the matrix part includes at least one of an acrylic-based polymer, a silicone-based polymer, a urethane-based polymer, or an imide-based polymer.

In an exemplary embodiment, the low-refractive index layer has a transmittance of about 95% or more in a wavelength of about 400 nm to about 700 nm, and a refractive index of about 1.1 to about 1.5 in a wavelength of about 632 nm.

In an exemplary embodiment, the first light is a blue light, the first conversion material is a first quantum dot that converts the blue light into a green light, and the second conversion material is a second quantum dot that converts the blue light into a red light.

In an exemplary embodiment, the electronic device further includes a display element disposed on the color conversion member.

In an exemplary embodiment, the display element includes a liquid crystal element.

In an exemplary embodiment, the light source member includes a guide panel and a light source disposed at one side of the guide panel. The low-refractive index layer is disposed between the guide panel and the color conversion member.

In an exemplary embodiment, the low-refractive index layer is directly disposed on the guide panel.

In an exemplary embodiment, the electronic device further includes a barrier layer disposed on at least one of top and bottom surfaces of the color conversion member.

In an exemplary embodiment, the color conversion member includes a plurality of color conversion parts that are spaced apart from each other on a plane. The color conversion parts include a first color conversion part including the first conversion material, a second color conversion part including the second conversion material, and a third color conversion part configured to transmit the first light.

In an exemplary embodiment, the color conversion member further includes a light blocking part disposed between the first to third color conversion parts spaced apart from each other.

In an exemplary embodiment, the electronic device further includes a reflection layer disposed on at least one of upper and lower portions of the color conversion parts. The reflection layer transmits the first light and reflects the second and third light.

In an exemplary embodiment, the low-refractive index layer is disposed between the reflection layer and the color conversion parts and covers the color conversion parts.

In an exemplary embodiment, the reflection layer is disposed between the low-refractive index layer and the color conversion parts and covers the color conversion parts.

In an exemplary embodiment, the color conversion member further includes a barrier layer disposed on at least one of upper and lower portions of the color conversion parts.

In an exemplary embodiment, the barrier layer is disposed between the low-refractive index layer and the color conversion parts and covers the color conversion parts.

In an exemplary embodiment, the color conversion member further includes an optical filter layer configured to transmit at least one of the second and third light.

In an exemplary embodiment, the optical filter layer includes a first optical filter layer disposed on the first color conversion part, and a second optical filter layer disposed on the second color conversion part.

In an exemplary embodiment, the first optical filter layer transmits a green light, and the second optical filter layer transmits a red light.

In an exemplary embodiment, the electronic device further includes a first base substrate disposed on the light source member, a second base substrate disposed on the light source member and facing the first base substrate, and a liquid crystal layer disposed on the light source member between the first and second base substrates. The color conversion member is disposed between the liquid crystal layer and the second base substrate.

In an exemplary embodiment, the low-refractive index layer is disposed between the liquid crystal layer and the color conversion member or between the color conversion member and the second base substrate.

In an exemplary embodiment, the electronic device further includes a first polarizing layer disposed between the light source member and the first base substrate or between the first base substrate and the liquid crystal layer, and a second polarizing layer disposed between the liquid crystal layer and the second base substrate.

In an exemplary embodiment, the light source member includes an organic electroluminescent element.

In an exemplary embodiment, the color conversion member further includes a dam part that partitions the color conversion parts from each other and is disposed between adjacent color conversion parts of the color conversion parts.

In an exemplary embodiment, the color conversion member further includes a color filter layer disposed on the color conversion parts. The color filter layer includes a plurality of filter parts configured to emit light having various colors, and a light blocking part configured to partition the filter parts from each other and disposed between adjacent filter parts of the filter parts.

According to an exemplary embodiment, an electronic device includes a light source member configured to provide a first light, a color conversion member disposed on the light source member and including a first conversion material that converts the first light into a second light and a second conversion material that converts the first light into a third light, and a low-refractive index layer disposed on the light source member and disposed on at least one of upper and lower portions of the color conversion member. The low-refractive index layer includes a matrix part, a plurality of hollow inorganic particles dispersed in the matrix part and including a plurality of first voids, and a plurality of second voids defined by the matrix part. A mean diameter of the first voids is greater than a mean diameter of the second voids.

In an exemplary embodiment, the low-refractive index layer includes the plurality of first voids and the plurality of second voids. A first volume that is the sum of volumes of the first voids is greater than a second volume that is the sum of volumes of the second voids.

According to an exemplary embodiment, an electronic device includes a display element, a guide panel disposed below the display element, a light source member disposed adjacent to at least one surface of the guide panel, a color conversion member disposed between the guide panel and the display element, and a low-refractive index layer disposed between the guide panel and the color conversion member. The low-refractive index layer includes a matrix part, a plurality of hollow inorganic particles dispersed in the matrix part, and a plurality of void parts defined by the matrix part.

In an exemplary embodiment, the light source member includes a light emitting element configured to emit a blue light. The color conversion member includes a green quantum dot excited by the blue light to emit a green light, and a red quantum dot excited by at least one of the blue light and the green light to emit a red light.

In an exemplary embodiment, each of the hollow inorganic particles includes a core part filled with air and a shell part defining the core part, and a mean diameter of the core parts is greater than a mean diameter of the void parts.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Figure 1:
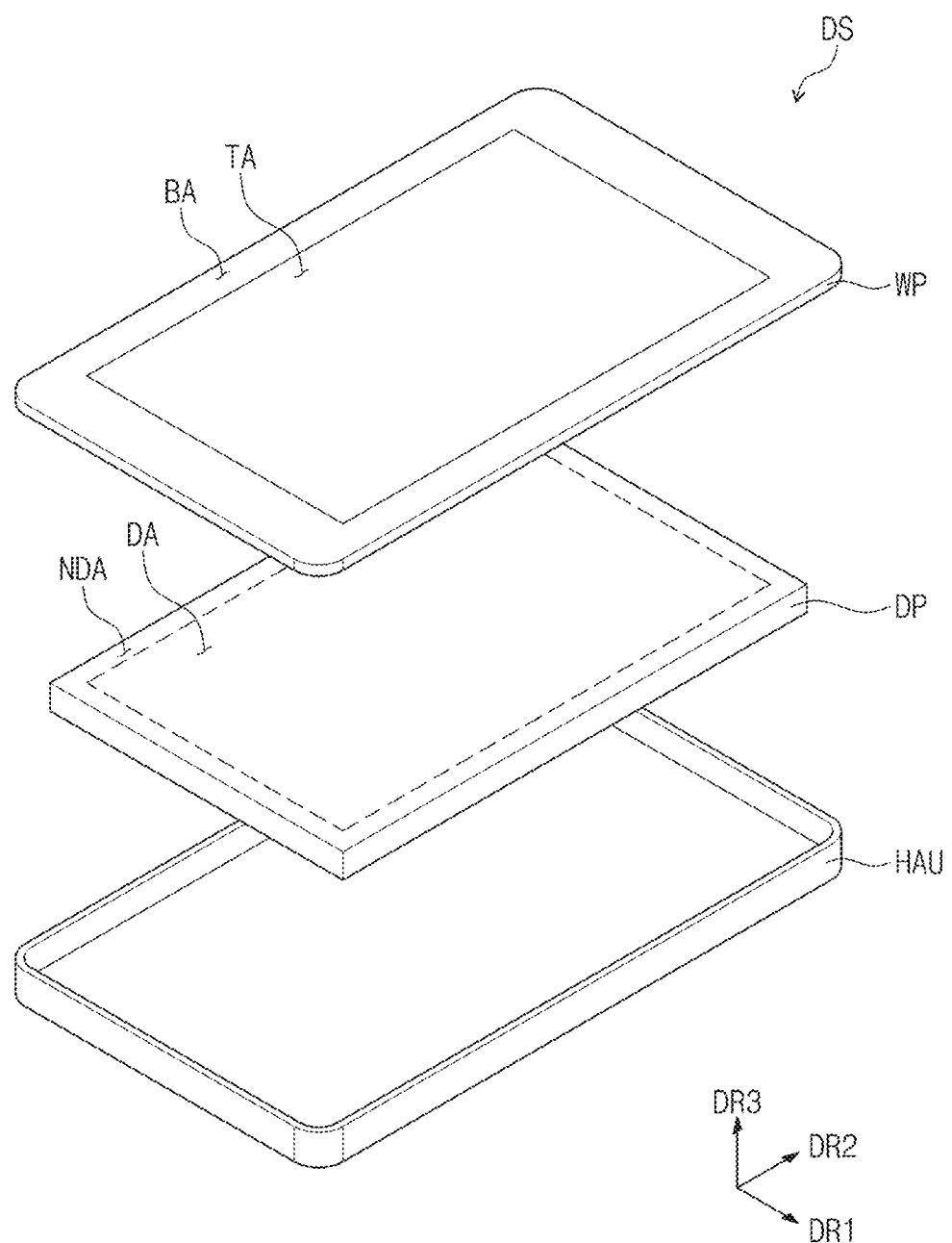
FIG. 1 is an exploded perspective view of an electronic device according to an exemplary embodiment of the inventive concept.

Exemplary embodiments of the inventive concept will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

Herein, the term "directly disposed" may mean that there is no layer, film, region, plate, etc. between a portion of the layer, the film, the region, the plate, etc. and the other portion. For example, "directly disposed" may mean being disposed without using an additional member such as an adhesion member between two layers or two members.

It will be understood that the terms "first," "second," "third," etc. are used herein to distinguish one element from another, and the elements are not limited by these terms. Thus, a "first" element in an exemplary embodiment may be described as a "second" element in another exemplary embodiment. Further, the terms of a singular form may include plural forms unless referred to the contrary.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. In addition, it will also be understood that when a layer is referred to as being "between" two layers, it can be the only layer between the two layers, or one or more intervening layers may also be present.

The terms "about" or "approximately" as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

It should be understood that descriptions of features or aspects within each exemplary embodiment should typically be considered as available for other similar features or aspects in other exemplary embodiments, unless the context clearly indicates otherwise.

Hereinafter, a low-refractive index layer and an electronic device including the low-refractive index layer according to exemplary embodiments of the inventive concept will be described with reference to the accompanying drawings.

Figure 2:
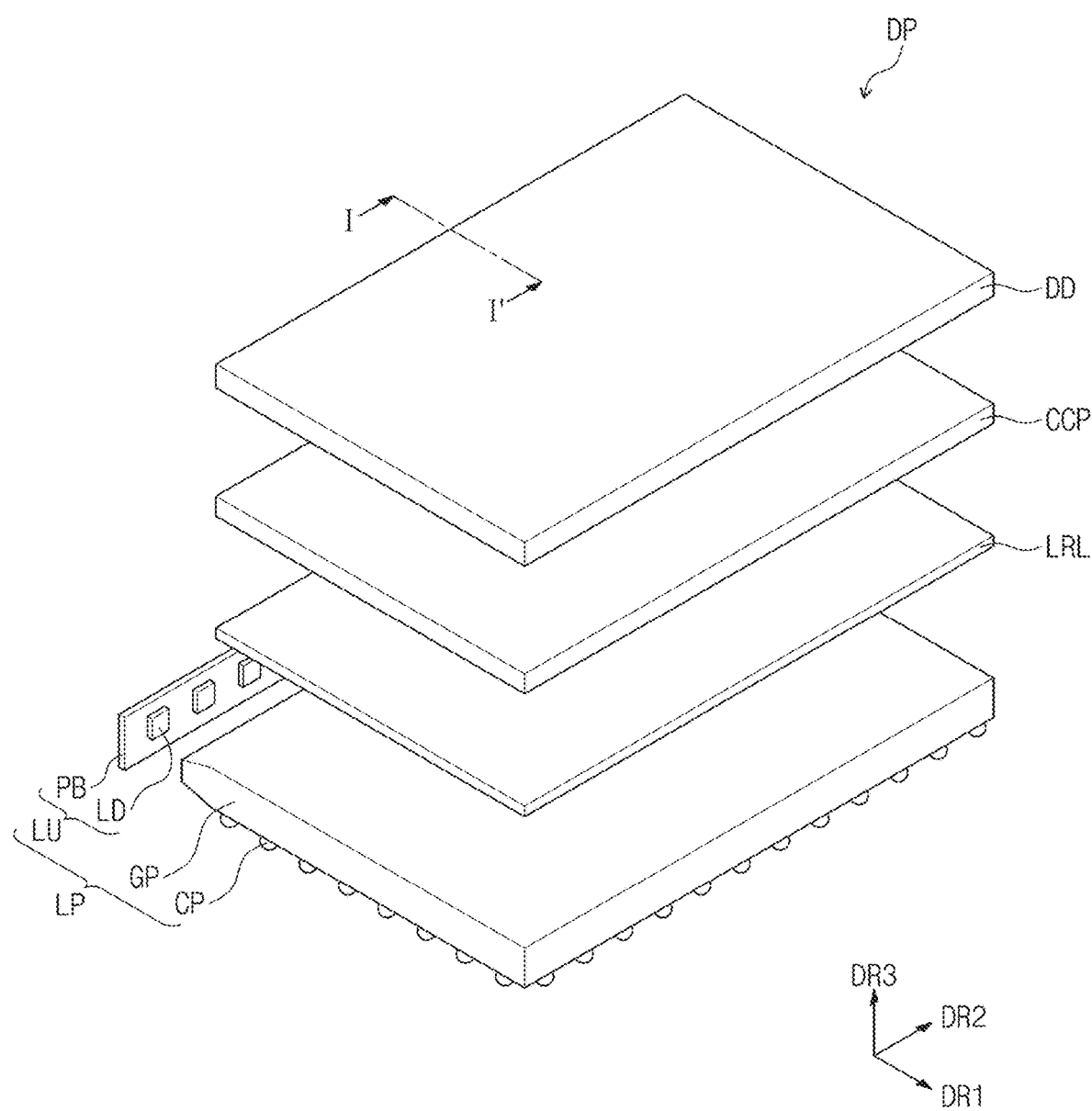
FIG. 2 is an exploded perspective view of a display member according to an exemplary embodiment of the inventive concept.

FIG. 1 is an exploded perspective view of an electronic device according to an exemplary embodiment of the inventive concept. FIG. 2 is an exploded perspective view of a display member according to an exemplary embodiment of the inventive concept. For example, FIG. 2 is an exploded perspective view of a display member DP provided in an electronic device DS of FIG. 1 according to an exemplary embodiment of the inventive concept.

The electronic device DS according to an exemplary embodiment may include various elements that are activated according to an electrical signal such as a display element, a touch element, or a detection element. The electronic device DS according to an exemplary embodiment may include a window member WP, a display member DP, and an accommodation member HAU.

The electronic device DS according to an exemplary embodiment may be a display device including a display element and providing an image. For example, the electronic device DS according to an exemplary embodiment may be a liquid crystal display device or an organic electroluminescence display device.

In FIG. 1 and the following drawings, a first directional axis DR1, a second directional axis DR2, and a third directional axis DR3 are illustrated. The directional axes described herein are relative concepts, and for convenience of description, a direction of the third directional axis DR3 may be defined as a direction in which an image is provided to a user. The first directional axis DR1 and the second directional axis DR2 may be perpendicular to each other. The third directional axis DR3 may be a normal direction with respect to a plane defined by the first direction DR1 and the second direction DR2. In FIG. 1, the plane defined by the first directional axis DR1 and the second directional axis DR2 may be a display surface on which an image is provided.

In the electronic device DS according to an exemplary embodiment, the window member WP may be disposed on the display member DP. The window member WP may be made of a material including, for example, glass, sapphire, or plastic. The window member WP may include a light transmitting area TA that transmits an image provided from the display member DP, and a light blocking area BA which is disposed adjacent to the light transmitting area TA and through which the image is not transmitted. The light transmitting area TA may be disposed in a central portion of the electronic device DS on the plane defined by the first and second directional axes DR1 and DR2. The light blocking area BA may be disposed in the periphery of the light transmitting area TA and have a frame shape surrounding the light transmitting area TA. However, the inventive concept is not limited thereto. For example, in an exemplary embodiment, the window member WP may include only the light transmitting area TA, and the light blocking area BA may be omitted. Also, in an exemplary embodiment, the light blocking area BA may be disposed on only at least one side of the light transmitting area TA instead of surrounding the light transmitting area TA.

Unlike FIG. 1, the window member WP may be omitted in the electronic device DS according to an exemplary embodiment.

In the electronic device DS according to an exemplary embodiment, the display member DP may be disposed below the window member WP. The display member DP may include a liquid crystal display element or an organic electroluminescence display element.

A surface of the display member DP, on which an image is displayed, is defined as a display surface on a plane. The display surface includes a display area DA in which an image is displayed on the display surface and a non-display area NDA in which an image is not displayed. The display area DA may be defined at a center of the display member DP on the plane to overlap the light transmitting part TA of the window member WP.

The accommodation member HAU may be disposed below the display member DP to accommodate the display member DP. The accommodation member HAU may be disposed to cover the display member DP so that a top surface that is the display surface of the display member DP is exposed. In an exemplary embodiment, the accommodation member HAU may cover a side surface and a bottom surface of the display member DP and expose the entire top surface of the display member DP. In an exemplary embodiment, the accommodation member HAU may cover a portion of the top surface in addition to the side surface and the bottom surface of the display member DP.

Referring to FIG. 2, the electronic device DS according to an exemplary embodiment may include a low-refractive index layer LRL. The electronic device DS according to an exemplary embodiment may include a light source member LP, a color conversion member CCP disposed on the light source member LP, and the low-refractive index layer LRL disposed between the light source member LP and the color conversion member CCP according to an exemplary embodiment. The low-refractive index layer LRL provided in the electronic device DS according to an exemplary embodiment may be a layer that converts a path of light. For example, the low-refractive index layer LRL may function to extract light in relation to the adjacent layer or member.

The display member DP according to an exemplary embodiment, which is provided in the electronic device DS according to an exemplary embodiment, may include the light source member LP and a display element DD. The display member DP may include the color conversion member CCP disposed on the light source member LP, and the low-refractive index layer LRL disposed between the light source member LP and the color conversion member CCP.

In an exemplary embodiment, the low-refractive index layer LRL may be disposed on the light source member LP and may be disposed on at least one of upper and lower portions of the color conversion member CCP. In an exemplary embodiment, the low-refractive index layer LRL may be disposed directly on the guide panel GP. For example, the low-refractive index layer LRL may make direct contact with the guide panel GP.

The light source member LP may include a light source unit LU and a guide panel GP. The light source unit LU may provide first light. The light source unit LU may include a circuit board PB and a light emitting element LD disposed on the circuit board PB. The light source unit LU may also be referred to herein as a light source. In an exemplary embodiment, the light source unit LU is disposed at one side of the guide panel GP.

The circuit board PB may provide power to the mounted light emitting element LD. For example, the circuit board PB may provide a dimming signal and a driving voltage to the mounted light emitting element LD. The circuit board PB may include at least one insulation layer and at least one circuit layer. For example, the circuit board PB may be a metal core printed circuit board (MCPCB).

A plurality of light emitting elements LD may be disposed on the circuit board PB. The light emitting elements LD may emit light in response to a voltage supplied from the circuit board PB. Each of the light emitting elements may include a light emitting diode having a structure in which an n-type semiconductor layer, an active layer, and a p-type semiconductor layer are sequentially laminated and emit light through recombination of electrons and holes when a driving voltage is applied.

In an exemplary embodiment, the plurality of light emitting elements LD may have light having the same wavelength range. In contrast, in an exemplary embodiment, the light source unit LU may include a plurality of light emitting elements LD that emit light having wavelength ranges different from each other. In an exemplary embodiment, the light emitting element LD may emit first light having a central wavelength in a wavelength range of about 440 nm to about 460 nm. In an exemplary embodiment, the light emitting element LD may emit blue light.

The light source member LP may include the guide panel GP. The light source unit LU may be disposed on at least one side of the guide panel GP. The first light emitted from the light source unit LU may be incident to at least one side of the guide panel GP. Then, the first light may be guided in the guide panel GP and provided to the display element DD. For example, the blue light emitted from the light source unit LU may be incident to the guide panel GP and transmitted to the color conversion member CCP. Thereafter, the light that is converted in wavelength may be provided from the color conversion member CCP to the display element DD.

In the exemplary embodiment of FIG. 2, although one side of the guide panel GP, which is adjacent to the light source unit LU, has a cross-section that is gradually inclined to one side surface of the guide panel GP, which is adjacent to the light source unit LU, the inventive concept is not limited thereto.

The guide panel GP may be made of a material having high light transmittance in a visible right region. For example, the guide panel GP may be glass. Alternatively, the guide panel GP may be made of a transparent polymer resin such as polymethyl methacrylate (PMMA). In an exemplary embodiment, the guide panel GP may have a refractive index of about 1.4 to about 1.55.

The light emitted from the light emitting element LD may be incident to the guide panel GP. An emission pattern part CP may be further disposed on a bottom surface of the guide panel GP. The emission pattern part CP may be disposed on the bottom surface of the guide panel GP and have a shape that convexly protrudes to the accommodation member HAU. For example, the emission pattern part CP may have a lens shape that is convex to the accommodation member HAU. However, the inventive concept is not limited thereto.

The emission pattern part CP may be made of a material having a refractive index different from that of the guide panel GP. The emission pattern part CP may transmit the light incident from the light source unit LU to one side surface of the guide panel GP to the other side surface of the guide panel GP, or change a direction of the incident light so that the light incident toward the bottom surface of the guide panel GP is transmitted toward the emission surface, which is a top surface of the guide panel GP. The emission pattern part CP may change a path of the light provided to the bottom surface of the guide panel GP to allow the light to be emitted to the display element DD.

In the display member DP according to an exemplary embodiment, the low-refractive index layer LRL may be disposed on the light source member LP. The low-refractive index layer LRL may be disposed on the guide panel GP.

Figure 3:
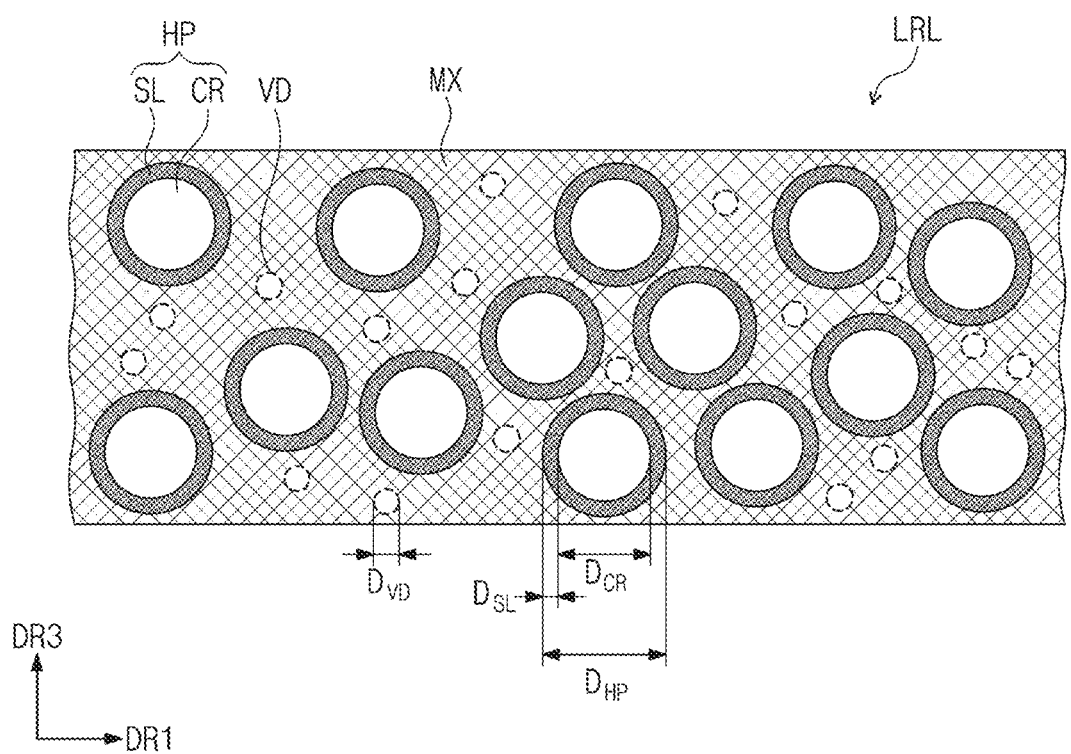
FIG. 3 is a cross-sectional view of a low-refractive index layer according to an exemplary embodiment of the inventive concept.
Figure 4:
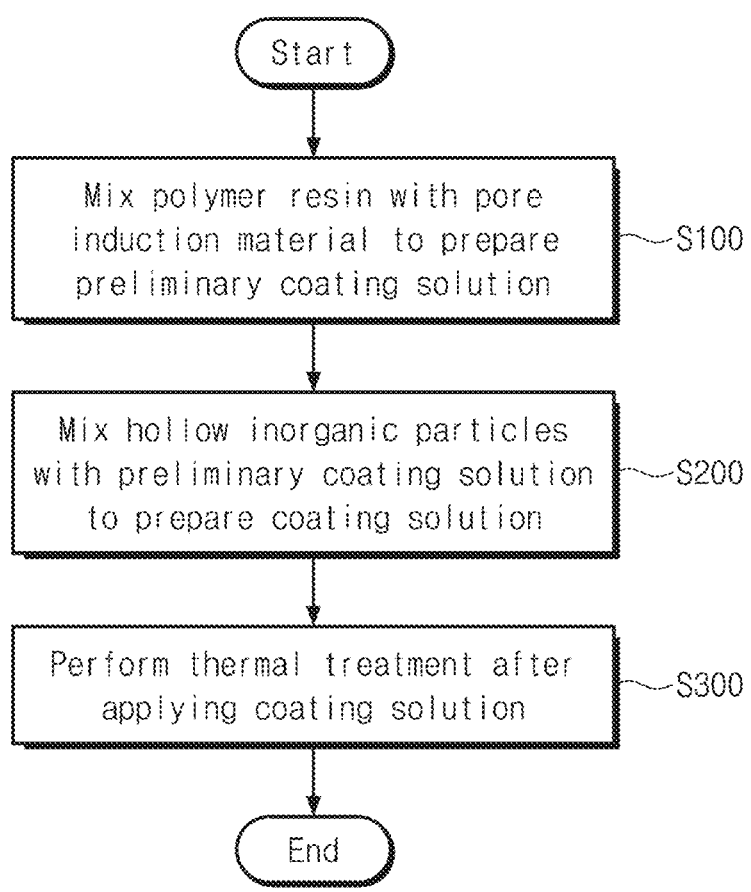
FIG. 4 is a flowchart illustrating a method of manufacturing the low-refractive index layer according to an exemplary embodiment of the inventive concept.
Figure 5A:
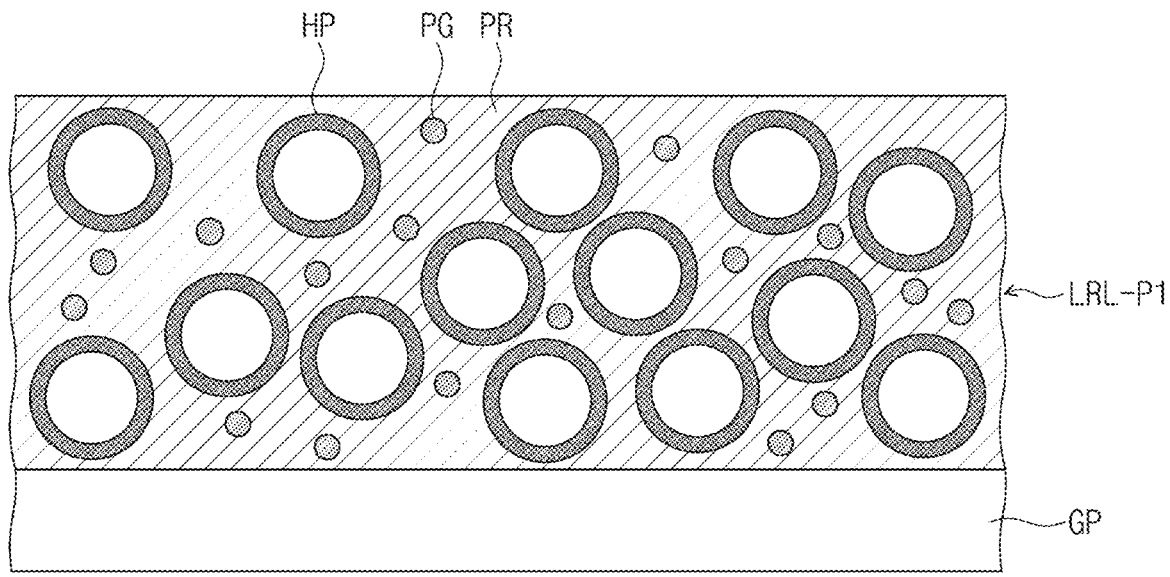
FIGS. 5A to 5C are views illustrating processes in a method of manufacturing a low-refractive index layer according to an exemplary embodiment of the inventive concept.
Figure 5B:
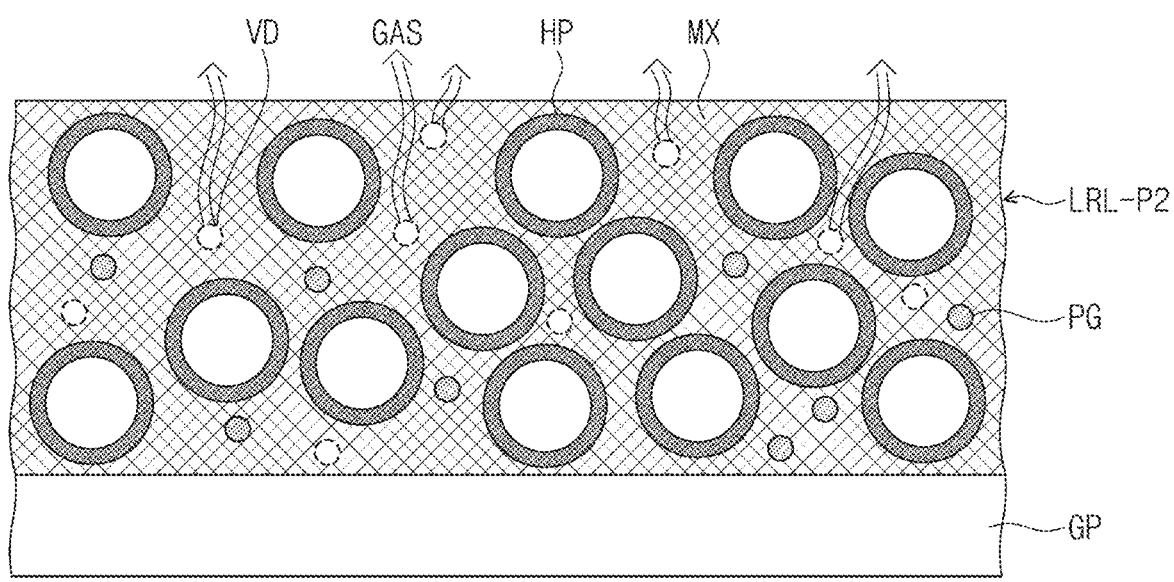
Figure 5C:
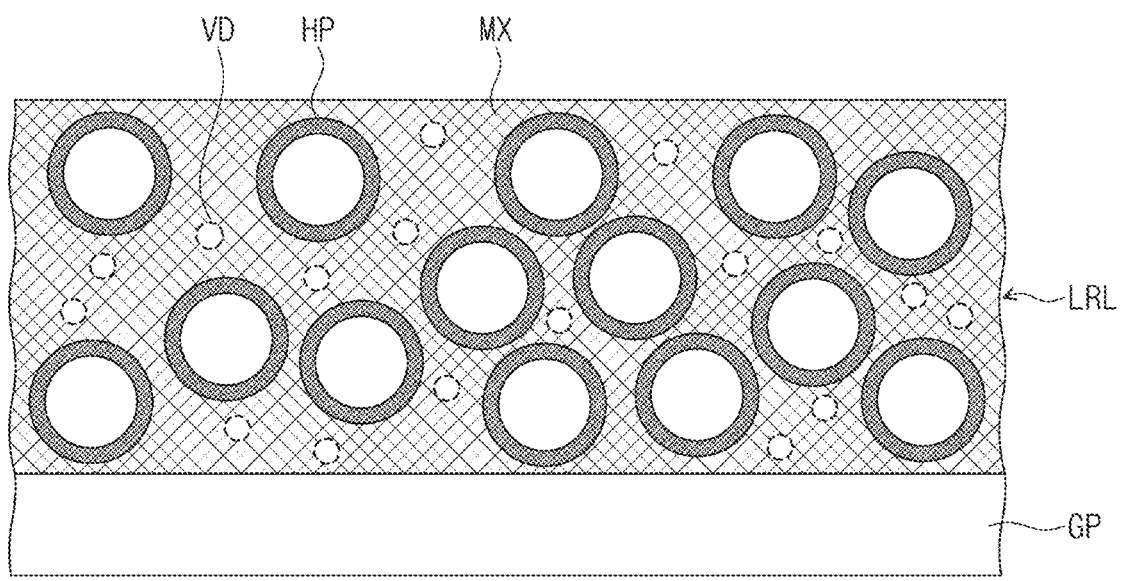

FIG. 3 is a cross-sectional view of the low-refractive index layer according to an exemplary embodiment of the inventive concept. FIG. 4 is a flowchart illustrating a method of manufacturing the low-refractive index layer according to an exemplary embodiment of the inventive concept. FIGS. 5A to 5C are views illustrating processes in a method of manufacturing a low-refractive index layer according to an exemplary embodiment of the inventive concept.

FIG. 3 is a cross-sectional view of the low-refractive index layer LRL according to an exemplary embodiment of the inventive concept. Referring to FIG. 3, the low-refractive index layer LRL may include a matrix part MX, hollow inorganic particles HP, and void parts VD. As shown in FIG. 3, the low-refractive index layer LRL may include a plurality of hollow inorganic particles HP and a plurality of void parts VD.

The plurality of hollow inorganic particles HP may be spread throughout the matrix part MX, and the plurality of void parts VD may be defined by the matrix parts MX. For example, the void parts may correspond to portions that are not filled with the matrix part MX.

The matrix part MX may include a polymer material. The matrix part MX may include at least one of an acrylic-based polymer, a silicone-based polymer, a urethane-based polymer, or an imide-based polymer. For example, the matrix part MX may include one of polymeric materials selected from acrylic-based polymers, silicone-based polymers, urethane-based polymers, and imide-based polymers, or a combination of a plurality of polymer materials. Also, the matrix part MX may include at least one of a siloxane polymer, a silsesquioxane polymer, an acrylic-based polymer substituted with a fluorine atom, a silicone-based polymer substituted with a fluorine atom, a urethane-based polymer substituted with a fluorine atom, or an imide polymer substituted with a fluorine atom.

The matrix part MX may be made of, for example, an acrylic-based resin, a silicone-based resin, a urethane-based resin, or an imide-based resin. The matrix part MX may be formed by solidifying a polymer resin such as, for example, an acrylic-based resin, a silicone-based resin, a urethane-based resin, or an imide-based resin in a high temperature process or an ultraviolet treatment process.

In an exemplary embodiment, each of the hollow inorganic particles HP included in the low-refractive index layer LRL may have a core shell shape. In an exemplary embodiment, each of the hollow inorganic particles HP may have a sphere shape. Each of the hollow inorganic particles HP may include a core part CR and a shell part SL surrounding the core part CR. The core part CR may be defined by the shell part SL. For example, the shell part SL may surround the core part CR, and the core part CR may be defined by the inner wall of the shell part SL. In an exemplary embodiment, an entirety of an inner space of the shell part SL defined by the inner wall of the shell part SL may correspond to the core part CR. The shell part SL may be a layer made of an inorganic material. The shell part SL may include at least one of, for example, $SiO_2$, $MgF_2$, and $Fe_3O_4$. For example, in the low-refractive index layer LRL according to an exemplary embodiment, the hollow inorganic particle HP may be hollow silica.

The shell part SL in each hollow inorganic particle HP may include an inorganic layer defining the core part CR and made of at least one of, for example, $SiO_2$, $MgF_2$, and $Fe_3O_4$, and an organic layer surrounding an outer surface of the inorganic layer. The organic layer may serve to enhance the dispersibility of the hollow inorganic particles HP in the matrix part MX. For example, the organic layer may be disposed on an outer surface of the shell part SL to allow the hollow inorganic particles HP to be uniformly dispersed in the matrix part MX without agglomerating the hollow inorganic particles HP.

The core part CR of the hollow inorganic particles HP may be filled with air. However, the inventive concept is not limited thereto. For example, in an exemplary embodiment, the core part CR may be filled with a liquid or a gas having low refractive characteristics. In an exemplary embodiment, the core part CR may be a void defined by the shell part SL.

In an exemplary embodiment, the hollow inorganic particles HP may have the sphere shape. Also, a cross-section of each hollow inorganic particle HP may have a circular shape. The hollow inorganic particles HP may have a mean diameter of about 20 nm to about 200 nm. Referring to FIG. 3, a diameter $D_{HP}$ of the hollow inorganic particle HP may represent a diameter up to the outermost portion of the shell part SL. In an exemplary embodiment, the hollow inorganic particles HP included in the low-refractive index layer LRL may have a mean diameter of about 20 nm to about 200 nm, which results in an improved/optimized thickness and refractive index value of the low-refractive index layer LRL.

In the hollow inorganic particles HP, the shell part SL may have a thickness $D_{SL}$ of about 7 nm to about 10 nm. The shell part SL may have a thickness $D_{SL}$ of about 7 nm to about 10 nm to maintain strength of the hollow inorganic particles HP while increasing/maximizing a volume of the core part CR.

In the hollow inorganic particles HP, the core part CR may be filled with air, or a low-refractive index material may be included in the core part CR to control the refractive index of the low-refractive index layer LRL. For example, the hollow inorganic particle HP may have a refractive index of about 1.0 to about 1.3.

In an exemplary embodiment, the low-refractive index layer LRL may include a plurality of void parts VD. The void parts VD may be portions defined by the matrix part MX. The matrix part MX may be filled into the void parts VD. Thus, each of the void parts VD may be empty. For example, each void part VD may be an empty space defined to be surrounded by the matrix part MX. Each void part VD may be a portion that is filled with air. Each void part VD filled with the air may be a portion at which the refractive index of the low-refractive index layer LRL is reduced.

Each void part VD may be a space having a sphere shape. Referring to FIG. 3, each of the void parts VD may have a mean diameter $D_{VD}$ of about 1 nm to about 5 nm. In an exemplary embodiment, the low-refractive index layer LRL may include the void parts VD and the hollow inorganic particles HP, and thus, may have high durability while maintaining a low refractive index value.

In the low-refractive index layer LRL according to an exemplary embodiment, each void part VD defined by the matrix part MX may be an open pore, and each core part CR defined by the shell part SL may be a closed pore.

The void part VD corresponding to the open pore may be a portion that is not filled with the matrix part MX, and a boundary of the void part VD may be defined by the matrix part MX. Here, in an exemplary embodiment, a separate boundary material for dividing the void part VD and the matrix part MX is not provided. Also, in comparison, the core part CR corresponding to the closed pore may be an inner space of the hollow inorganic particle HP defined by the shell part SL.

In the low-refractive index layer LRL including the hollow inorganic particles HP and the void parts VD according to an exemplary embodiment, the core part CR that is the pore provided by the hollow inorganic particle HP may be defined as a first void, and the void part VD may be defined as a second void. For example, the low-refractive index layer LRL according to an exemplary embodiment may include the hollow inorganic particles HP having the first void and the void parts VD having the second void.

In an exemplary embodiment, each of the first void and the second void may have the sphere shape. In an exemplary embodiment, the first voids may have a mean diameter greater than that of the second voids. Referring to FIG. 3, the first void may have a diameter corresponding to a diameter $D_{CR}$ of the core part CR, and the second void may have a diameter corresponding to a diameter $D_{VD}$ of the void part VD. The diameter $D_{CR}$ of the hollow inorganic particle HP may represent a diameter up to the innermost portion of the shell part SL.

In the low-refractive index layer LRL according to an exemplary embodiment, the total volume of the plurality of first voids may be greater than that of the plurality of second voids. For example, a first volume that is the sum of the volumes of the first voids may be greater than that a second volume that is the sum of the volumes of the second voids. Thus, in an exemplary embodiment, the total volume of the first voids provided by all of the hollow inorganic particles HP may be greater than the total volume of the second voids provided by all of the void parts VD.

The low-refractive index layer LRL according to an exemplary embodiment may include all of the first voids corresponding to the closed pore defined by the shell part SL and the second voids corresponding to the void part VD defined by the matrix part MX.

In the low-refractive index layer LRL according to an exemplary embodiment, the void part VD may be made of a pore induction material (e.g., porogen). The low-refractive index layer LRL according to an exemplary embodiment may be formed by mixing a polymer resin, the pore induction material, and the hollow inorganic particles HP, and then by solidifying the polymer resin through a heat treatment process or ultra violet (UV) treatment process at a high temperature.

FIG. 4 is a flowchart illustrating a method of manufacturing the low-refractive index layer LRL according to an exemplary embodiment of the inventive concept. The method of manufacturing the low-refractive index layer LRL may include a process of mixing a polymer resin and a pore induction material to manufacture a preliminary coating solution (S100), a process of mixing a hollow inorganic particle into the preliminary coating solution to manufacture a coating solution (S200), and a process of performing heat treatment after applying the coating solution (S300).

The process of manufacturing the preliminary coating solution (S100) may be a process of mixing the polymer resin forming a matrix part MX with a pore induction material forming a void part VD. The preliminary coating solution may be a solution in which the polymer resin and the pore induction material are blended, or a solution in which the polymer resin and the pore induction material are polymerized in the form of a copolymer.

The polymer resin may include at least one of, for example, an acrylic-based polymer, a silicone-based polymer, a urethane-based polymer, or an imide-based polymer. For example, the polymer resin may include one of polymeric materials selected from acrylic-based polymers, silicone-based polymers, urethane-based polymers, and imide-based polymers, or a combination of a plurality of polymer materials. The polymer resin may include at least one of, for example, a siloxane polymer, a silsesquioxane polymer, an acrylic-based polymer substituted with a fluorine atom, a silicone-based polymer substituted with a fluorine atom, a urethane-based polymer substituted with a fluorine atom, or an imide polymer substituted with the fluorine atom. For example, the siloxane polymer may include organically modified silicate or a polymer to which a silane-based monomer is condensed.

The pore induction material included in the preliminary coating solution may be either linear type or dendrimer type.

For example, the linear type pore induction material may be a single molecule of hydrocarbon which may be represented by a chemical structure

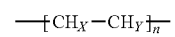

(x, y, and n are each independently an integer of 1 or more), branched poly(p-xylene), linear poly(p-phenylene), linear polybutadiene, branched polyethylene, polycarbonates, polyamideimide, polyphthalamide, polymethylstyrene, etc.

The dendrimer-type pore induction material may include a core portion and a branch portion bonded to the core portion so as to be connected in a regular branch structure and having a shape that is diffused to the outside. The core portion of the dendrimer-type pore induction material may be, for example, cyclosiloxane, cyclodextrin, bezene, etc. In the dendrimer type pore induction material, a hydrocarbon group which is represented by a chemical structure

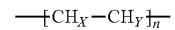

may be applied to the branch portion.

For example, when the polymer resin and the pore induction material are provided in the blended state in the preliminary coating solution, the polymer resin and the pore induction material may be in the mixed state without any chemical bonding.

For example, when the preliminary coating solution is provided in the polymerized state in the form of the copolymer in the preliminary coating solution, at least one of the above-described pore induction materials may be graft-polymerized to at least one of the above-described polymer resin materials. When the polymer resin and the pore induction material are provided in the polymerized state in the form of the copolymer, the pore induction material may be polymerized in the form of a bridge connecting the polymer resin materials to each other. When graft-polymerized, the plurality of pore induction materials which are bonded to the polymer resin by side chains may be the same or different from each other. When polymerized in the form of the bridge, the plurality of pore induction materials connecting the polymer resin materials to each other may be the same or different from each other.

In the following chemical structures, A-1 and A-2 represent cases in which a siloxane polymer is used as the polymer resin, and the pore induction material is graft-polymerized.

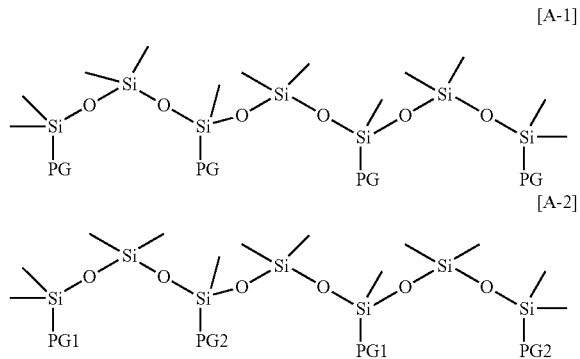

The following chemical structures B-1 and B-2 represent cases in which a siloxane polymer is used as the polymer resin, and the pore induction material is polymerized in the form of the bridge between the siloxane polymers.

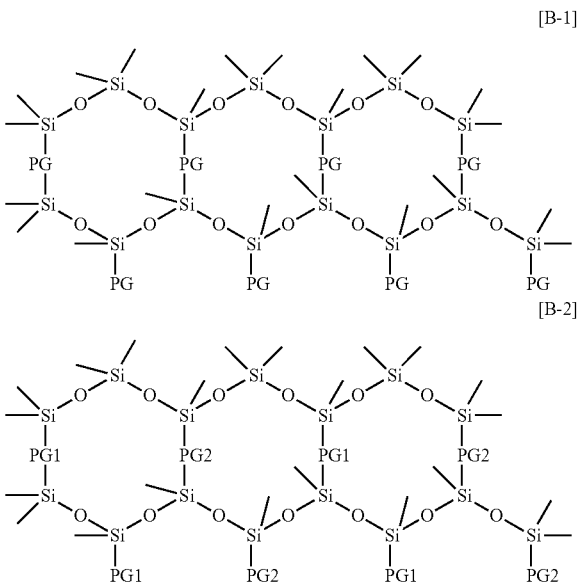

The chemical structures A-1, A-2, B-1, and B-2 represent cases in which the polymer resin and the pore induction material are polymerized to be provided as the preliminary coating solution. In the chemical structures A-1, A-2, B-1, and B-2, PG, PG1, and PG2 represent the pore induction materials, respectively.

Referring to FIG. 4, in the method of manufacturing the low-refractive index layer, after the process of manufacturing the preliminary coating solution (S100) is performed, the process of mixing the hollow inorganic particle into the preliminary coating solution to manufacture the coating solution (S200) may be performed. For example, the polymer resin, the pore induction material, and the hollow inorganic particle may be included in the coating solution.

In an exemplary embodiment, unlike FIG. 4, the process of manufacturing the preliminary coating solution (S100) and the process of manufacturing the coating solution (S200) may be performed in the same process. For example, the polymer resin, the pore induction material, and the hollow inorganic particle may be mixed with each other in the same process and provided as the coating solution. For example, in an exemplary embodiment, the process of manufacturing the preliminary coating solution (S100) and the process of manufacturing the coating solution (S200) may be performed in the same process at substantially the same time.

For example, in the coating solution, the pore induction material may be included in an amount of about 1 wt % to about 20 wt %, and the hollow inorganic particle may be included in an amount of about 10 wt % to about 60 wt % on the basis of 100 wt % of the polymer resin.

When the content of pore induction material exceeds about 20 wt %, a ratio of the void parts in the low-reflective index manufactured from the coating solution according to an exemplary embodiment may be relatively high to deteriorate strength of the low-refractive index layer. Also, since the pore induction material is included in the coating solution at a content of about 1 wt % or more, the void part made of the pore induction material may be introduced into the low-refractive index layer to appropriately maintain the content of hollow inorganic particles so that the low-refractive index layer manufactured thereafter has a low refractive index. For example, since the pore induction material together with the hollow inorganic particles are used to maintain the low refractive index of the low-refractive index layer, the void part made of the pore induction material may be provided in the low-refractive index layer to partially reduce the content of hollow inorganic particles, thereby reducing manufacturing costs.

When the content of hollow inorganic particles in the coating solution on the basis of the polymer resin is less than about 10 wt %, the refractive index value of the low-refractive index layer manufactured from the coating solution may not be maintained to be low. Also, when the content of hollow inorganic particles on the basis of the polymer resin exceeds about 60 wt %, a haze value of the low-refractive index layer manufactured from the coating solution may increase.

Referring to FIG. 4, in the method of manufacturing the low-refractive index layer according to an exemplary embodiment, after the process of manufacturing the coating solution (S200) is performed, a process of applying the coating solution to thermally treat the applied coating solution (S300) may be performed. The application of the coating solution may be performed through various methods such as, for example, slit coating, spin coating, roll coating, spray coating, inkjet printing, etc. The heat treatment of the coating solution may be performed at a temperature of about 150° C. to about 250° C. The polymer resin may be thermally cured by the heat treatment process of the coating solution to form a matrix part MX. Here, the pore induction material may be pyrolyzed and removed to form a void part VD.

FIGS. 5A to 5C are views illustrating the method of manufacturing the low-refractive index layer according to an exemplary embodiment of the inventive concept. FIG. 5A illustrates a process of providing a coating solution LRL-P1 on a guide panel GP. FIG. 5B illustrates a process of thermally treating the provided coating solution LRL-P1. FIG. 5C illustrates a state in which the low-refractive index layer LRL is formed on the guide panel GP after the processes of FIGS. 5A and 5B.

Referring to FIG. 5A, the coating solution LRL-P1 containing the polymer resin PR, the pore induction material PG, and the hollow inorganic particles HP may be provided on the guide panel GP.

FIG. 5B illustrates a process of thermally treating the coating solution LRL-P1 provided in the process of FIG. 5A. The heat treatment may be performed at a temperature of about 150° C. to about 250° C. A preliminary low-refractive index layer LRL-P2 may be formed by the heat treatment of the coating solution LRL-P1. The preliminary low-refractive index layer LRL-P2 may indicate a state in which the heat treatment proceeds.

The polymer resin PR of the coating solution LRL-P1 may be solidified by the heat treatment to form the matrix part MX. The pore induction material PG may be decomposed by the heat treatment to form the empty void part VD. For example, the pore induction material PG may be pyrolyzed under the high-temperature heat treatment condition and discharged to a gas GAS, and the void part VD defined by the matrix part MX may be provided at a portion in which the pore induction material PG is included. FIG. 5C illustrates a state after the preliminary low-refractive index layer LRL-P2 is thermally treated. In FIG. 5C, the low-refractive index layer LRL may be disposed on the guide panel GP and include the matrix part MX, the plurality of hollow inorganic particles HP dispersed in the matrix part MX, and the plurality of void parts VD defined by the matrix part MX.

Although the process of manufacturing the low-refractive index layer LRL is described when the low-refractive index layer LRL is disposed on the guide panel GP, as shown in the example of FIGS. 5A to 5C, the inventive concept is not limited thereto. For example, in an exemplary embodiment, the low-refractive index layer LRL may be disposed on an upper or lower portion of the color conversion member CCP (see FIG. 2). In this case, the low-refractive index layer LRL may be provided by the processes described with reference to FIGS. 5A to 5C.

The low-refractive index layer LRL manufactured by the method of manufacturing the low-refractive index layer according to an exemplary embodiment, which is described with reference to FIGS. 4 and 5A to 5C, may have a transmittance of about 95% or more in a wavelength of about 400 nm to about 700 nm, and a refractive index of about 1.1 to about 1.5 in a wavelength of about 632 nm.

The low-refractive index layer LRL manufactured by the method of manufacturing the low-refractive index layer according to an exemplary embodiment, which is described with reference to FIGS. 4 and 5A to 5C, may have a good low refractive index value and improved durability.

In the low-refractive index layer LRL according to an exemplary embodiment, the void part VD may correspond to the pore formed by the pyrolysis of the pore induction material PG. Thus, although the void part VD is formed, in an exemplary embodiment, the low-refractive index layer is not reduced in volume and thickness to maintain the dimensional safety and the durability of the low-refractive index layer LRL even after the process of manufacturing the low-refractive index layer in FIGS. 4 and 5A to 5C.

The low-refractive index layer LRL described with reference to FIGS. 3, 4 and 5A to 5C according to an exemplary embodiment may include all of the hollow inorganic particles HP dispersed in the matrix part MX and the void part VD defined by the matrix part MX. As a result, internal strength and reliability characteristics may be improved while maintaining the low refractive index value.

Figure 6:
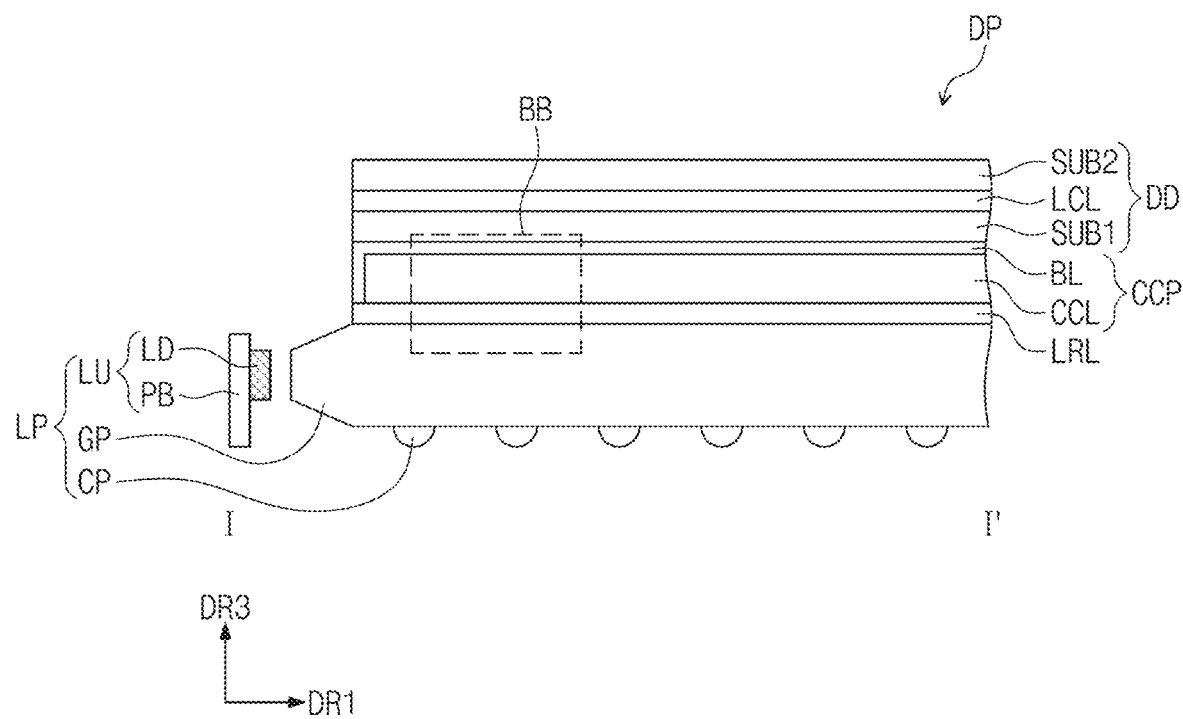
FIG. 6 is a cross-sectional view illustrating a portion corresponding to line I-I' of FIG. 2.

FIG. 6 is a cross-sectional view illustrating a portion of the display member according to an exemplary embodiment.

Figure 7:
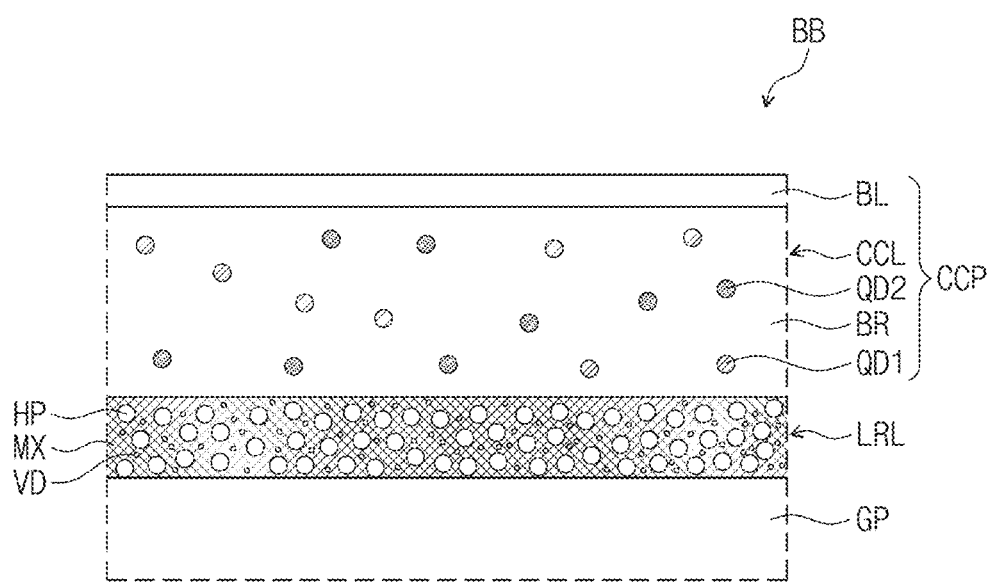
FIG. 7 is a cross-sectional view illustrating area BB of FIG. 6.

FIG. 6 is a cross-sectional view taken along line I-I' of FIG. 2. FIG. 7 is a detailed cross-sectional view illustrating area BB of FIG. 6.

Referring to FIGS. 2, 6, and 7, the low-refractive index layer LRL may be disposed on the guide panel GP. The slit coating, the spin coating, the roll coating, the spray coating, the inkjet printing, etc., which are described with reference to FIGS. 4 and 5A, may be performed as the coating method of forming the low-refractive index layer LRL. However, the method of forming the low-refractive index layer LRL is not limited thereto. For example, the low-refractive index layer LRL may be directly provided on the guide panel GP through various methods such as, for example, a transfer method. For example, the low-refractive index layer LRL may be directly applied to the guide panel GP through various coating methods or may be manufactured in a separate process by various coating methods and then provided on the guide panel GP by using the transfer method.

The low-refractive index layer LRL may have a refractive index less than that of the guide panel GP. The low-refractive index layer LRL may have a refractive index less than that of the color conversion member CCP disposed on the low-refractive index layer LRL. A difference between the refractive index of the low-refractive index layer LRL and the refractive index of the guide panel GP may be equal to or greater than about 0.2. The low-refractive index layer LRL may have a refractive index less than that of the guide panel GP. As a result, light incident from the light source unit LU to the guide panel GP may be effectively transferred to the other side surface of the guide panel GP, which is relatively spaced apart from the light unit LU.

A capping layer may be further disposed on the low-refractive index layer LRL. The capping layer may be a protection layer that protects the low-refractive index layer LRL. The capping layer may be an inorganic layer including at least one of, for example, silicon nitride, silicon oxide, or silicon oxynitride. The capping layer may be directly disposed on the low-refractive index layer LRL. The capping layer may be provided as a single layer or a plurality of layers.

The color conversion member CCP may be disposed on the low-refractive index layer LRL. The color conversion member CCP may include conversion materials QD1 and QD2 disposed between the light emitting member LP and the display element DD. The color conversion member CCP may convert a wavelength of first light provided from the light source unit LU. The color conversion member CCP may include a first conversion material QD1 that wavelength-converts the first light into second light, and a second conversion material QD2 that wavelength-converts the first light into third light. The display element DD may include a first substrate SUB1, a second substrate SUB2, and a liquid crystal layer LCL disposed between the first and second substrates SUB1 and SUB2.

The color conversion member CCP may further include a color conversion layer CCL including the first conversion material QD1 and the second conversion material QD2, and a barrier layer BL disposed on at least one of top and bottom surfaces of the color conversion layer CCL. For example, the barrier layer BL may be disposed on at least one of the top and bottom surfaces of the color conversion layer CCL.

The barrier layer BL may prevent moisture and/or oxygen (hereinafter, referred to as moisture/oxygen) from being permeated. The barrier layer BL may be disposed on the color conversion layer CCL to prevent the color conversion layer CCL from being exposed to the moisture/oxygen. The barrier layer BL may cover the color conversion layer CCL.

The barrier layer BL may include at least one inorganic layer. For example, the barrier layer BL may include an inorganic material. For example, the barrier layer BL may include at least one of silicon nitride, aluminum nitride, zirconium nitride, titanium nitride, hafnium nitride, titanium nitride, silicon oxide, aluminum oxide, titanium oxide, tin oxide, cesium oxide, silicon oxynitride, or a metal thin film having secured light transmittance. The barrier layer BL may further include an organic layer. The barrier layer BL may be a single layer or a plurality of layers.

The color conversion layer CCL may be directly disposed on the low-refractive index layer LRL. In this case, the barrier layer BL may be omitted on the lower surface of the color conversion layer CCL. The low-refractive index layer LRL may function as a barrier layer on the bottom surface of the color conversion layer CCL. Referring to FIG. 6, the barrier layer BL may be disposed on the color conversion layer CCL and may cover the color conversion layer CCL. In an exemplary embodiment, the barrier layer BL may entirely cover the color conversion layer CCL.

In an exemplary embodiment, the color conversion member CCP may include a first conversion material QD1 that wavelength-converts the first light provided from the light source unit LU into green light, and a second conversion material QD2 that wavelength-converts the first light into red light. In an exemplary embodiment, the first light may be blue light, but is not limited thereto. In an exemplary embodiment, the second conversion material QD2 may be excited by the second light.

The first conversion material QD1 may be green quantum dots excited by the blue light (the first light) to emit the green light (the second light), and the second conversion material QD2 may be red quantum dots excited by the green light (the second light) to emit the red light.

The quantum dots may be particles that convert a wavelength of the light provided from the light source unit LU. Each of the quantum dots may be a material having a crystal structure having a size of several nanometers. The quantum dot may be composed of hundreds to thousands of atoms to provide a quantum confinement effect in which an energy band gas increases due to the small size. When light having a wavelength with energy greater than that of the band gap is incident into the quantum dot, the quantum dot may absorb the light and thus be in an excited state to emit light having a specific wavelength, thereby becoming a ground state. The emitted light has a value corresponding to the band gap. When the quantum dot is adjusted in size and composition, light emitting characteristics due to the quantum confinement effect may be adjusted. The quantum dot may change a color of emitted light according to a size of the particle of the quantum dot. As the particle size of the quantum dot decreases, light having a shorter wavelength region may be emitted. For example, the quantum dot emitting the green light may have a particle size less than that of the quantum dot emitting the red light.

The quantum dot may be selected, for example, from Group II-VI compounds, Group III-V compounds, Group IV-VI compounds, Group IV elements, Group IV compounds, and a combination thereof.

The Group II-VI compounds may be selected from binary element compounds selected from the group consisting of, for example, CdSe, CdTe, ZnS, ZnSe, ZnTe, ZnO, HgS, HgSe, HgTe, MgSe, MgS, and a combination thereof, ternary element compounds selected from the group consisting of, for example, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and quaternary element compounds selected from the group consisting of, for example, HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compounds may be selected from binary element compounds selected from the group consisting of, for example, GaN, GaP, GaAs, GaSb, AlN, AlP, AlAs, AlSb, InN, InP, InAs, InSb, and a combination thereof, ternary element compounds selected from the group consisting of, for example, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof, and quaternary element compounds selected form the group consisting of, for example, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The Group IV-VI compounds may be selected from binary element compounds selected from the group consisting of, for example, SnS, SnSe, SnTe, PbS, PbSe, PbTe, and a combination thereof, ternary element compounds selected from the group consisting of, for example, SnSeS, SnSeTe, SnSTe, PbSeS, PbSeTe, PbSTe, SnPbS, SnPbSe, SnPbTe, and a combination thereof, and quaternary element compounds selected form the group consisting of, for example, SnPbSSe, SnPbSeTe, SnPbSTe, and a combination thereof. The Group IV elements may be selected from the group consisting of, for example, Si, Ge, and a combination thereof. The Group IV compounds may be binary element compounds selected from the group consisting of, for example, SiC, SiGe, and a combination thereof.

Here, the binary element compounds, the ternary element compounds, and the quaternary element compounds may exist in the particle at a uniform concentration or exist in the particle in a state in which concentration distribution is divided into partially different states.

The quantum dot may have a core shell structure including a shell surrounding a core. Alternatively, the quantum dot may have a core/shell structure in which one quantum dot surrounds the other quantum dot. An interface between the core and the shell may have a concentration gradient in which an element existing in the shell has a concentration that gradually decreases toward a center.

The quantum dot may have a particle having a size of a nano scale. The quantum dot may have a full width of half maximum (FWHM) of an emission wavelength spectrum of about 45 nm or less. In an exemplary embodiment, the quantum dot may have a FWHM of an emission wavelength spectrum of about 40 nm or less, or about 30 nm or less. In this range, color purity and color reproducibility may be improved. Light emitted through the quantum dot may be emitted in all directions to improve an optical viewing angle.

The quantum dot may have, for example, a spherical shape, a pyramidal shape, a multi-arm shape, a cubic nanoparticle shape, a nanotube shape, a nanowire shape, a nanofiber shape, a nanoplate particle shape, etc. However, the shape of the quantum dot is not limited thereto.

In the display member DP described with reference to FIGS. 2, 6, and 7, white light may be provided to the display element DD. In the display member DP according to an exemplary embodiment, light emitted from the light source unit LU that passes through the color conversion member CCP and is then provided to the display element DD may be white light. For example, the blue light provided from the light source unit LU, the green light emitted from the first conversion material QD1, and the red light emitted from the second conversion material QD2 may be mixed with each other and provided to the display element DD.

The color conversion member CCP may include the first conversion material QD1, the second conversion material QD2, and the base resin BR. The base resin BR may be a medium in which the first and second conversion materials QD1 and QD2 are dispersed. The base resin BR may include various resin compositions that are called binders. However, the inventive concept is not limited thereto. Herein, a medium capable of dispersing the first and second conversion materials QD1 and QD2 may be called the base resin BR regardless of its name, additional other functions, constituent materials, etc. The base resin BR may be, for example, a polymer resin. For example, the base resin BR may include an acrylic-based resin, a urethane-based resin, a silicon-based resin, and an epoxy-based resin. The base resin BR may be a transparent resin.

The display member DP according to an exemplary embodiment may have good optical characteristics and improved durability as a result of disposing the low-refractive index layer LRL having the improved strength while maintaining the low refractive index between the guide panel GP and the color conversion member CCP. For example, the electronic device DS (see FIG. 1) including the display member DP according to an exemplary embodiment may have good optical characteristics and also have improved durability and reliability.

Figure 8:
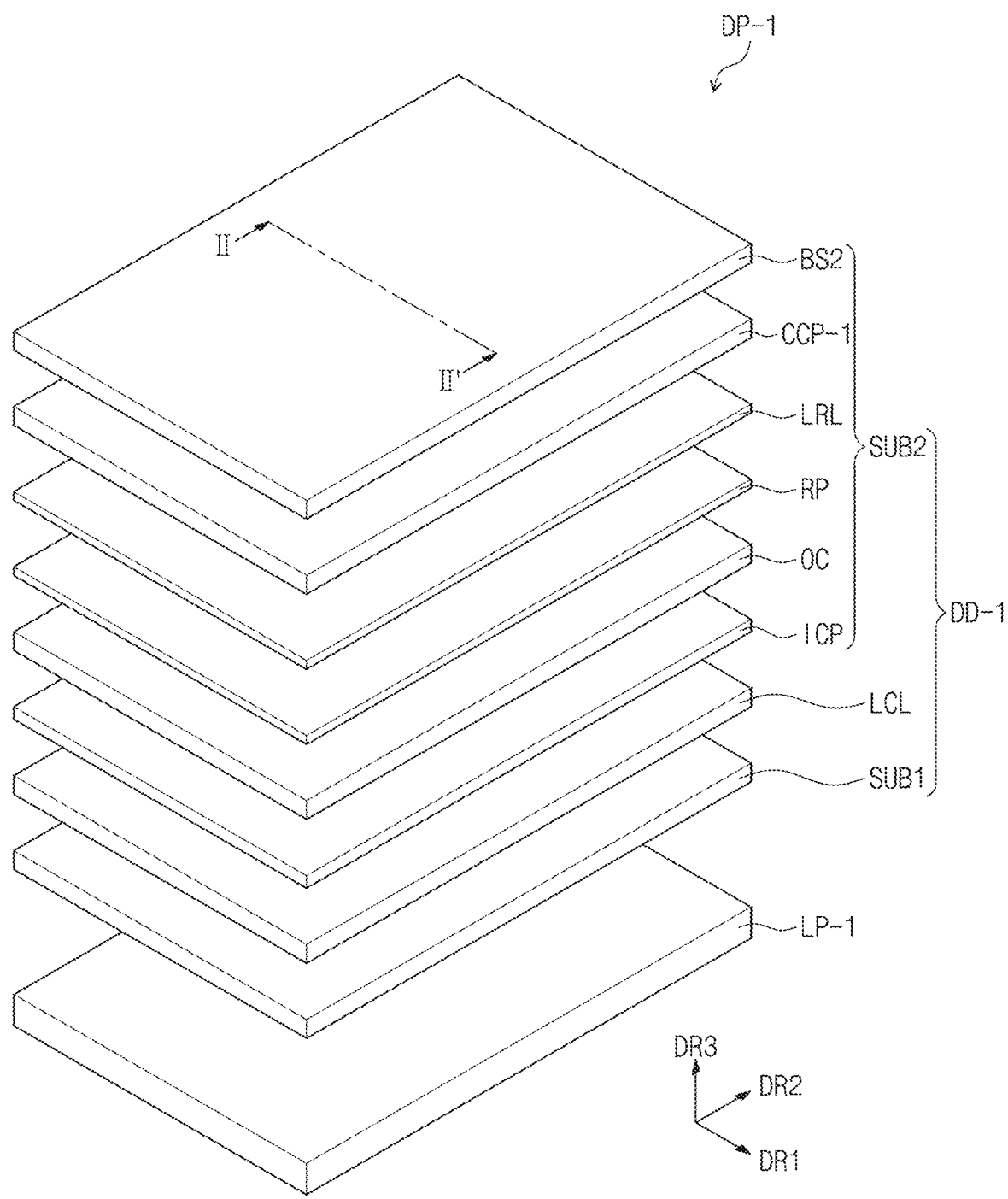
FIG. 8 is an exploded perspective view of a display member according to an exemplary embodiment of the inventive concept.
Figure 9:
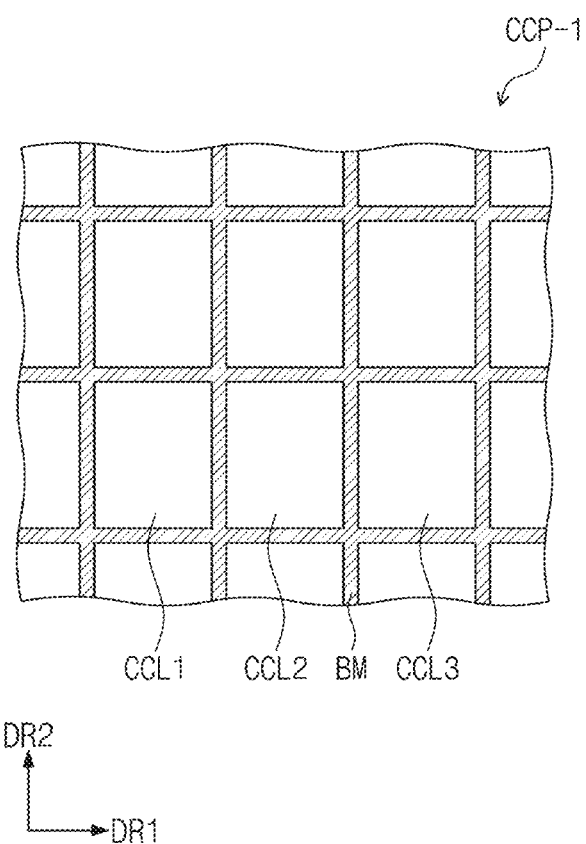
FIG. 9 is a plan view of a color conversion member according to an exemplary embodiment of the inventive concept.
Figure 10:
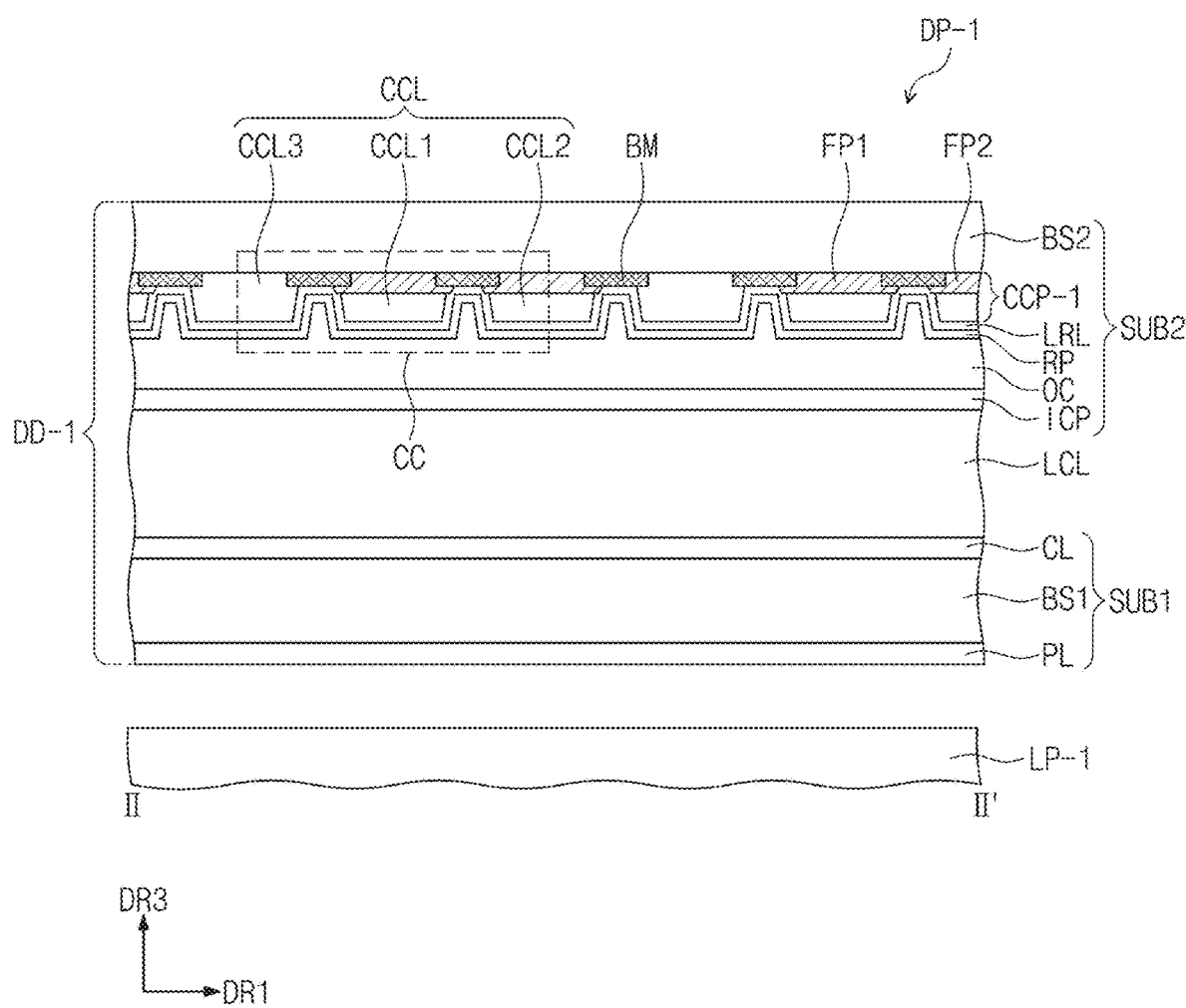
FIG. 10 is a cross-sectional view illustrating a portion corresponding to line II-II' of FIG. 8.
Figure 11:
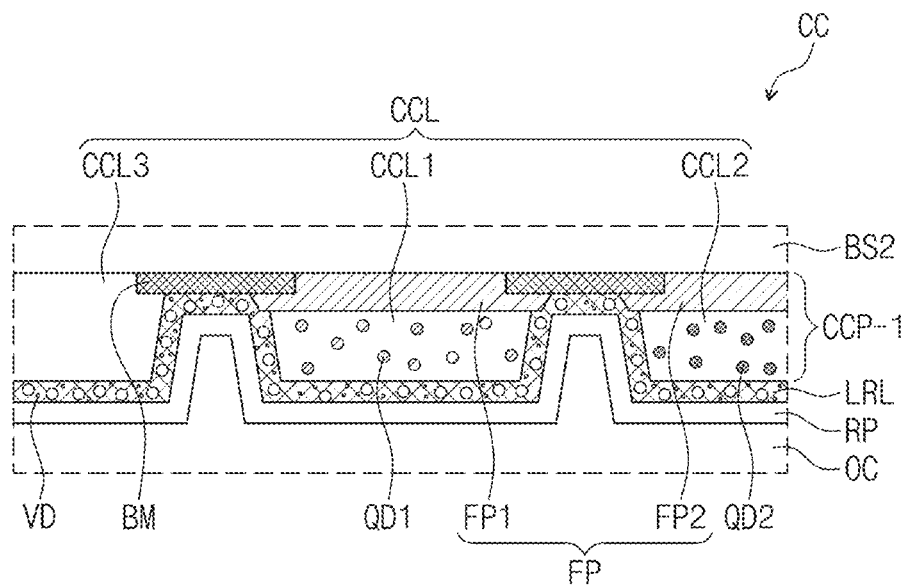
FIG. 11 is a cross-sectional view illustrating area CC of FIG. 10.
Figure 12:
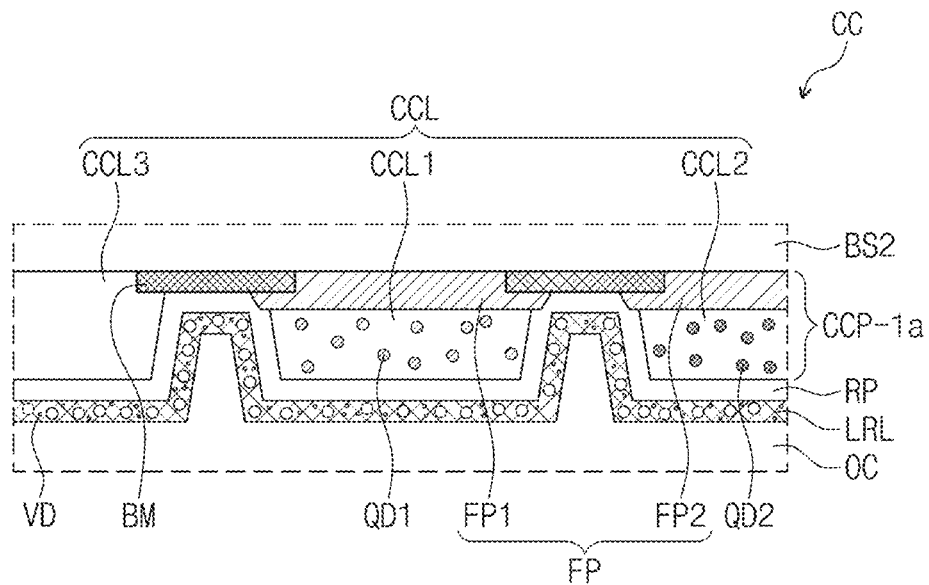
FIG. 12 is a cross-sectional view illustrating area CC of FIG. 11 according to an exemplary embodiment of the inventive concept.

FIG. 8 is a view illustrating an example of the display member provided in the electronic device DD (see FIG. 1) according to an exemplary embodiment of the inventive concept. FIG. 9 is a plan view illustrating a portion of the color conversion member provided in the display member of FIG. 8. FIG. 10 is a cross-sectional view illustrating a portion corresponding to line II-II' of FIG. 8. FIG. 11 is a cross-sectional view illustrating area CC of FIG. 10. FIG. 12 is a cross-sectional view illustrating area CC of FIG. 11 according to an exemplary embodiment of the inventive concept.

A display member DP-1 according to an exemplary embodiment may include first and second base substrate BS1 and BS2, which face each other, and a liquid crystal layer LCL disposed between the first base substrate BS1 and the second base substrate BS2 (see FIG. 10). For example, the display member DP-1 according to an exemplary embodiment may include a display element DD-1 on a light source member LP-1. The display element DD-1 may be a liquid crystal display element including a liquid crystal layer LCL disposed between the first and second base substrates BS1 and BS2 facing each other.

Referring to FIGS. 8 to 12, the display element DD-1 may include a color conversion member CCP-1. The color conversion member CCP-1 may be disposed on the liquid crystal layer LCL. The display element DD-1 may include a first substrate SUB1 that is relatively adjacent to the light source member LP-1 with the liquid crystal layer LCL disposed therebetween, and a second substrate SUB2 facing the first substrate SUB1 and including the color conversion member CCP-1.

The light source member LP-1 may be a backlight unit providing light to the display element DD-1. For example, although the light source member LP-1 includes a direct-type backlight unit or an edge-type backlight unit in an exemplary embodiment, the exemplary embodiment of the inventive concept is not limited thereto. For example, the light source member LP-1 is not limited as long as the light source member LP-1 provides light to the display element DD-1.

In the display member DP-1 according to an exemplary embodiment, the light source member LP-1 may provide first light to the display element DD-1. For example, the light source member LP-1 may provide blue light to the display element DD-1.

The first substrate SUB1 may include a first base substrate BS1 and a circuit layer CL disposed on the first base substrate BS1 (see FIG. 10).

The first base substrate BS1 may be a member providing a base surface on which the circuit layer CL is disposed. The first base substrate BS1 may be, for example, a glass substrate, a metal substrate, or a plastic substrate. However, the inventive concept is not limited thereto. For example, in an exemplary embodiment, the first base substrate BS1 may be an inorganic layer, an organic layer, or a composite layer.

In an exemplary embodiment, the circuit layer CL may be disposed on the first base substrate BS1, and the circuit layer CL may include a plurality of transistors. The transistors may include a control electrode, an input electrode, and an output electrode, respectively. For example, the circuit layer CL may include a switching transistor and a driving transistor, which are configured to drive the display element DD-1.

The display element DD-1 may further include a first polarizing layer PL and a second polarizing layer ICP. The first polarizing layer PL may be included in the first substrate SUB1, and the second polarizing layer ICP may be included in the second substrate SUB2. Referring to FIGS. 8 and 10, the first polarizing layer PL according to an exemplary embodiment may be disposed on a bottom surface of the first base substrate BS1. However, the inventive concept is not limited thereto. For example, in an exemplary embodiment, the first polarizing layer PL may be disposed on an upper surface of the first base substrate BS1. In this case, the first polarizing layer PL may be disposed between the liquid crystal layer LCL and the first base substrate BS1.

The first polarizing layer PL may be provided as a separate member, or may include a polarizer formed through coating or deposition. The first polarizing layer PL may be formed, for example, by applying a material containing a dichroic dye and a liquid crystal compound. Alternatively, the first polarizing layer PL may include a wire grid-type polarizer.

The second substrate SUB2 facing the first substrate SUB1 may include a second base substrate BS2, a color conversion member CCP-1, and a low-refractive index layer LRL. The second substrate SUB2 may further include a reflection layer RP, a planarization layer OC, and a second polarizing layer ICP.

The second base substrate BS2 may be a member providing a base surface on which the color conversion member CCP-1 is disposed. The second base substrate BS2 may be, for example, a glass substrate, a metal substrate, or a plastic substrate. However, the inventive concept is not limited thereto. For example, the second base substrate BS2 may be an inorganic layer, an organic layer, or a composite layer.

In the display member DP-1 according to an exemplary embodiment, the color conversion member CCP-1 may include a plurality of color conversion parts CCL1, CCL2, and CCL3 that are spaced apart from each other on the plane. The color conversion parts CCL1, CCL2, and CCL3 may be part of the color conversion layer CCL. The color conversion member CCP-1 may further include a light blocking part BM disposed between the color conversion parts CCL1, CCL2, and CCL3. Referring to FIG. 9, the plurality of color conversion parts CCL1, CCL2, and CCL3 may be arranged to be spaced apart from each other on the plane defined by the first directional axis DR1 and the second directional axis DR2.

Referring to FIG. 9, the first to third color conversion parts CCL1, CCL2, and CCL3, which emit light having colors different from each other, may be disposed in parallel to be spaced apart from each other in the direction of the first directional axis DR1, and the color conversion parts, which emit light having the same color, may be disposed in parallel to be spaced apart from each other. FIG. 9 illustrates an arrangement of the first to third color conversion parts CCL1, CCL2, and CCL3 according to an exemplary embodiment. However, the inventive concept is not limited thereto. For example, in an exemplary embodiment, the first to third color conversion parts CCL1, CCL2, and CCL3 may have areas different from each other or may be aligned with a pentile structure.

The light blocking part BM may be disposed between the color conversion parts CCL1, CCL2, and CCL3, which are disposed to be spaced apart from each other. The light blocking part BM may be a black matrix. The light blocking part BM may contain an organic light blocking material or an inorganic light blocking material including a black pigment or dye. The light blocking part BM may prevent a light leakage phenomenon from occurring and distinguish a boundary between the color conversion parts CCL1, CCL2, and CCL3 disposed adjacent to each other.

At least a portion of the light blocking part BM may be disposed to overlap the color conversion parts CCL1, CCL2, and CCL3, which are adjacent to each other. For example, at least a portion of the first light blocking part BM may be disposed to overlap the color conversion parts CCL1, CCL2, and CCL3, which are adjacent to each other in a thickness direction of the light blocking part BM, on a plane defined by the first directional axis DR1 and the third directional axis DR3.

In an exemplary embodiment, the color conversion member CCP-1 may include a first conversion material QD1 that absorbs the first light to wavelength-convert the first light into second light, and a second conversion material QD2 that absorbs the first light to wavelength-convert the first light into third light. For example, the first light may be the blue light, the second light may be the green light, and the third light may be the red light.

The descriptions of the conversion materials QD1 and QD2 included in the color conversion member CCP of FIGS. 6 and 7 according to the exemplary embodiment described above may be equally applied to the first and second conversion materials QD1 and QD2 included in the color conversion member CCP-1. For example, the first conversion material QD1 may be green quantum dots, and the second conversion material QD2 may be red quantum dots.

The color conversion member CCP-1 may include a first color conversion part CCL1 including the first conversion material QD1, a second color conversion part CCL2 including the second conversion material QD2, and a third color conversion part CCL3 that transmits the first light. For example, the first conversion material QD1 may absorb the first light (the blue light) to emit the green light, and the second conversion material QD2 may absorb the first light (the blue light) to emit the red light. For example, the first color conversion part CCL1 may be a first emission area that emits the green light, and the second color conversion part CCL2 may be a second emission area that emits the red light.

The third color conversion part CCL3 may be a portion that does not include the conversion material. The third color conversion part CCL3 may be a portion that transmits the first light provided from the light source member LP-1. For example, the third color conversion part CCL3 may be an area that transmits the blue light. The third color conversion part CCL3 may be made of, for example, a polymer resin. For example, the third color conversion part CCL3 may be made of an acrylic-based resin, a urethane-based resin, a silicone-based resin, an epoxy-based resin, etc. The third color conversion part CCL3 may be made of, for example, a transparent resin or a white resin.

The first to third color conversion parts CCL1, CCL2, and CCL3 may be disposed on the second base substrate BS2. The first to third color conversion parts CCL1, CCL2, and CCL3 may be provided to be patterned on one surface of the second base substrate BS2. The first to third color conversion parts CCL1, CCL2, and CCL3 may be disposed on a bottom surface of the second base substrate BS2.

In the display member DP-1 according to an exemplary embodiment, the low-refractive index layer LRL may be disposed between the light source member LP-1 and the color conversion member CCP-1. The descriptions of the low-refractive index layer LRL described with reference to FIGS. 3 to 5C may be equally applied to the low-refractive index layer LRL described herein. For example, the low-refractive index layer LRL may include the matrix part MX (see FIG. 3), the plurality of hollow inorganic particles HP (see FIG. 3) dispersed in the matrix part MX (see FIG. 3), and the void parts VD (see FIG. 3) defined by the matrix part MX (see FIG. 3). The void parts VD of the low-refractive index layer LRL may be made of a pore induction material PG.

In the display member DP-1 according to an exemplary embodiment, the low-refractive index layer LRL may be disposed below the color conversion member CCP-1, and may convert a traveling direction of light emitted from the color conversion member CCP-1 to a lower side of the display member DP-1. For example, the low-refractive index layer LRL may be disposed below the color conversion member CCP-1, and may perform a light extraction function of reflecting the light emitted from the color filter layer CCP-1 again to allow the light to travel to an upper side of the display member DP-1. Thus, the display member DP-1 according to an exemplary embodiment may have improved durability and light efficiency.

However, the inventive concept is not limited thereto. For example, in an exemplary embodiment, the low-refractive index layer LRL may be disposed above the color conversion member CCP-1.

In the display member DP-1 according to an exemplary embodiment, the second substrate SUB2 may further include a reflection layer RP. The reflection layer RP may be disposed between the color conversion member CCP-1 and the liquid crystal layer LCL. The reflection layer RP may transmit the first light and reflect the second light and the third light. The reflection layer RP may be, for example, a selective transmission-reflection layer.

The reflection layer RP may transmit the first light provided from the light source member LP-1 and reflect the second and third light, which are emitted from the color conversion parts CCL1, CCL2, and CCL3 of the color conversion member CCP-1, to travel to the lower side of the display member DP-1, to allow the reflected light to be emitted to the upper side of the display member DP-1. The reflection layer RP may be provided as a single layer or a laminate in which a plurality of layers are laminated.

The reflection layer RP may include, for example, a plurality of insulation layers. Thus, transmission and reflection wavelength ranges of the reflection layer RP may be determined depending on the refractive index difference between the laminated layers, a thickness of each of the laminated layers, and the number of laminated layers.

The reflection layer RP according to an exemplary embodiment may include a first insulation layer and a second insulation layer, which have refractive indices different from each other. The reflection layer RP may include at least one first insulation layer and at least one second insulation layer. Each of the first insulation layer and the second insulation layer may be provided in plurality that are alternately laminated.

For example, a metal oxide material may be used as an insulation layer having a relatively high-refractive index. The insulation layer having the high-refractive index may include, for example, at least one of TiOx, TaOx, HfOx, or ZrOx. The insulation layer having a relatively low-refractive index may include, for example, SiOx or SiNx. In an exemplary embodiment, the reflection layer RP may be formed by alternately and repeatedly depositing SiNz and SiOx.

Referring to FIGS. 10 and 11, the reflection layer RP may be disposed below the low-refractive index layer LRL. For example, the low-refractive index layer LRL may be disposed between the reflection layer RP and the color conversion parts CCL1, CCL2, and CCL3 to cover the color conversion parts CCL1, CCL2, and CCL3.

However, the inventive concept is not limited thereto. For example, as illustrated in FIG. 12, the reflection layer RP may be disposed on the low-refractive index layer LRL. Referring to FIG. 12, a color conversion member CCP-1a, the reflection layer RP, and the low-refractive index layer LRL may be sequentially disposed with respect to the second base substrate BS2. For example, the reflection layer RP may be disposed between the low-refractive index layer LRL and the color conversion parts CCL1, CCL2, and CCL3 to cover the color conversion parts CCL1, CCL2, and CCL3.

In an exemplary embodiment, the color conversion member CCP-1 and CCP-1a may further include optical filter layers FP1 and FP2 disposed on the color conversion layer CCL including the first to third color conversion parts CCL1, CCL2, and CCL3. The optical filter layers FP1 and FP2 may be included in an optical filter layer FP.

The optical filter layers FP1 and FP2 may be disposed on the color conversion layer CCL including the first to third color conversion parts CCL1, CCL2, and CCL3 to block the first light and transmit the second light or the third light. For example, the optical filter layers FP1 and FP2 may block blue light and transmit green light or red light. In an exemplary embodiment, the optical filter layers FP1 and FP2 may be disposed on the first and second color conversion parts CCL1 and CCL2 and are not disposed on the third color conversion part CCL3.

The optical filter layers FP1 and FP2 may be provided as a single layer or have a shape in which a plurality of layers are laminated. For example, the optical filter layers FP1 and FP2 may be a single layer including a material that absorbs blue light, or the optical filter layers FP1 and FP2 may be a structure in which an insulation film having a low refractive index and an insulation film having a high refractive index are laminated, like the reflection layer RP.

The optical filter layers FP1 and FP2 may include a pigment or a dye to block light having a specific wavelength. For example, in an exemplary embodiment, each of the optical filter layers FP1 and FP2 may be a yellow color filter layer that absorbs the blue light to block the blue light.

The optical filter layers FP1 and FP2 may include a first optical filter layer FP1 disposed on the first color conversion part CCL1 and a second optical filter layer FP2 disposed on the second color conversion part CCL2. The first optical filter layer FP1 may be a filter layer that blocks the blue light and transmits the green light. The second optical filter layer FP2 may be a filter layer that blocks the blue light and transmits the red light.

The second substrate SUB2 may further include a planarization layer OC. In the second substrate SUB2, the reflection layer RP or the low-refractive index layer LRL may be disposed to surround unevenness of the color conversion parts CCL1, CCL2, and CCL3. For example, in a process of manufacturing the display member DP-1 according to an exemplary embodiment, the reflection layer RP and the low-refractive index layer LRL may be disposed on the color conversion parts CCL1, CCL2, and CCL3 after the color conversion parts CCL1, CCL2, and CCL3 are disposed on the second base substrate BS2. Thus, the reflection layer RP and the low-refractive index layer LRL may be disposed along the unevenness of the color conversion layer CCL including the color conversion parts CCL1, CCL2, and CCL3 to form an unevenness corresponding to the unevenness of each of the color conversion parts CCL1, CCL2, and CCL3. The planarization layer OC may be disposed below the reflection layer RP or the low-refractive index layer LRL.

The planarization layer OC may be disposed to surround the unevenness of the reflection layer RP and the low-refractive index layer LRL. The planarization layer OC may be disposed to be filled into the unevenness of the bottom surface of the reflection layer RP or the low-refractive index layer LRL, which is adjacent to the liquid crystal layer LCL, to planarize a surface adjacent to the second polarizing layer ICP.

The second polarizing layer ICP may be included in the second substrate SUB2. The second polarizing layer ICP may be disposed between the liquid crystal layer LCL and the color conversion member CCP-1. The second polarizing layer ICP may be an in-cell polarizer. The second polarizing layer ICP may be formed by applying a material containing a dichroic dye and a liquid crystal compound. Alternatively, the second polarizing layer ICP may include a wire grid-type polarizing layer.

Although the low-refractive index layer LRL is disposed below the color conversion members CCP-1 and CCP-1a in the electronic device and the display member DP-1 described with reference to FIGS. 8 to 12, the inventive concept is not limited thereto. For example, in an exemplary embodiment, the low-refractive index layer LRL may be disposed above the color conversion members CCP-1 and CCP-1a. The low-refractive index layer LRL may be disposed above the color conversion parts CCL1, CCL2, and CCL3 to improve efficiency of the light emitted to the outside.

In the electronic device and the display member DP-1 described with reference to FIGS. 8 to 12 according to an exemplary embodiment, the low-refractive index layer LRL, which has a good low refractive index value and is improved in strength, may be provided to improve durability. Also, the low-refractive index layer LRL may be disposed above or below the color conversion members CCP-1 and CCP-1a to improve light extraction efficiency in the display member DP-1. For example, the electronic device DS (see FIG. 1) including the display member DP-1 according to an exemplary embodiment may have improved durability and reliability and also have superior optical efficiency.

Figure 13:
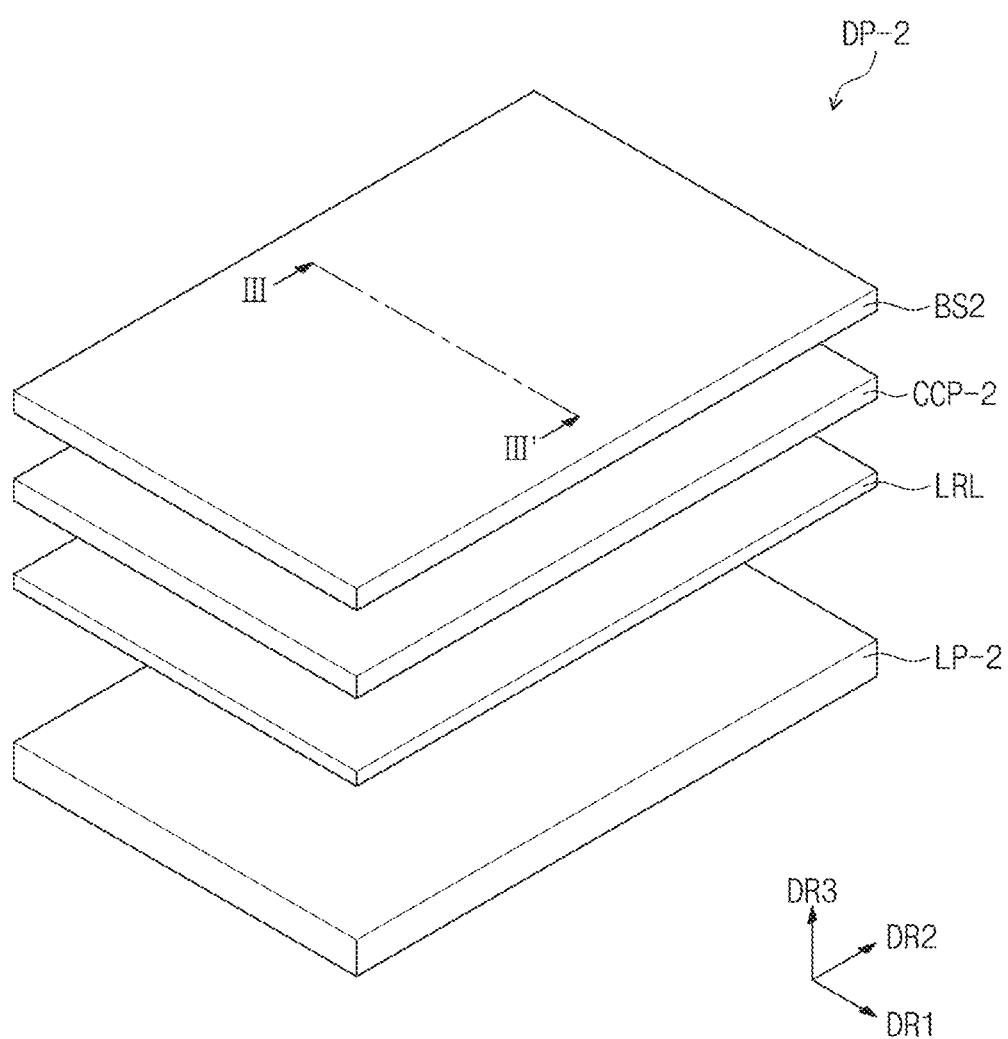
FIG. 13 is an exploded perspective view of a display member according to an exemplary embodiment of the inventive concept.
Figure 14:
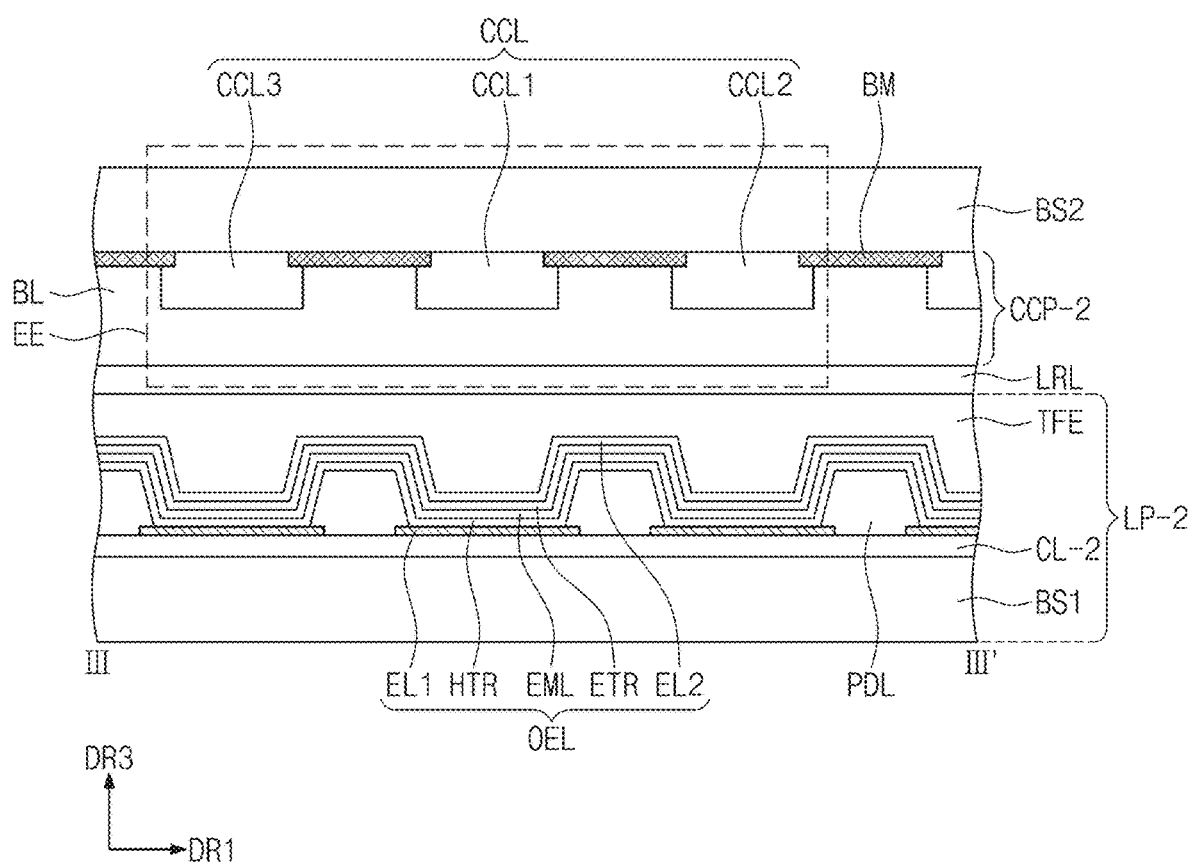
FIG. 14 is a cross-sectional view illustrating a portion corresponding to line III-III' of FIG. 13.
Figure 15:
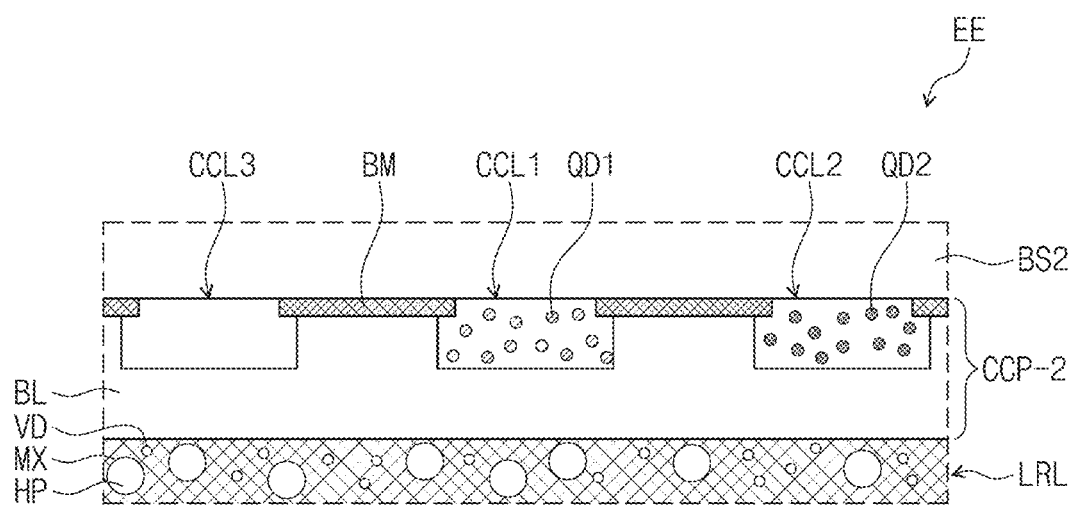
FIG. 15 is a cross-sectional view illustrating area EE of FIG. 14.
Figure 16:
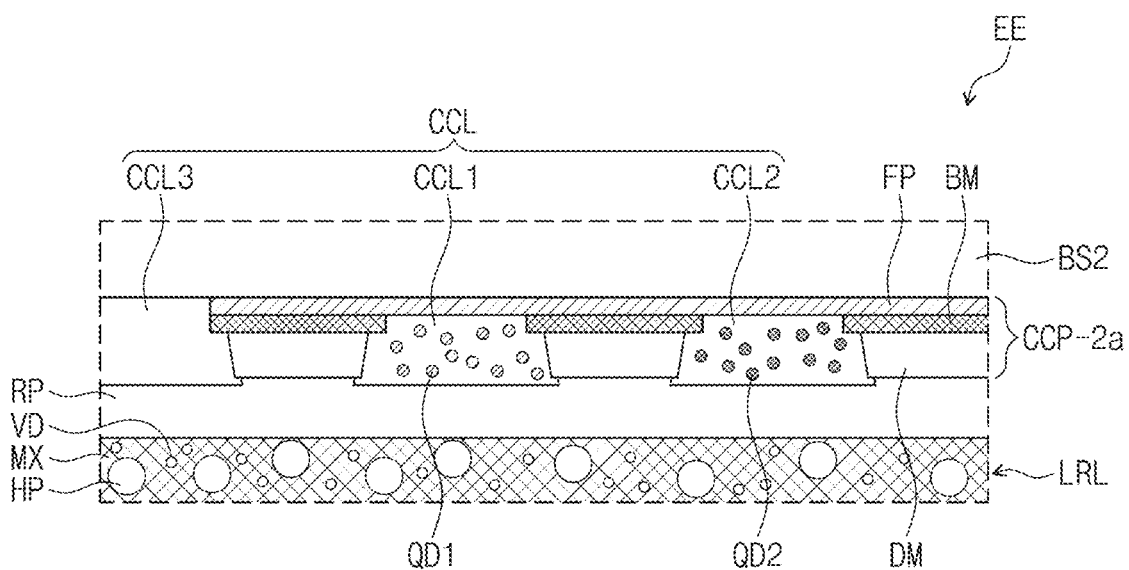
FIG. 16 is a cross-sectional view illustrating area EE of FIG. 15 according to an exemplary embodiment of the inventive concept.
Figure 17:
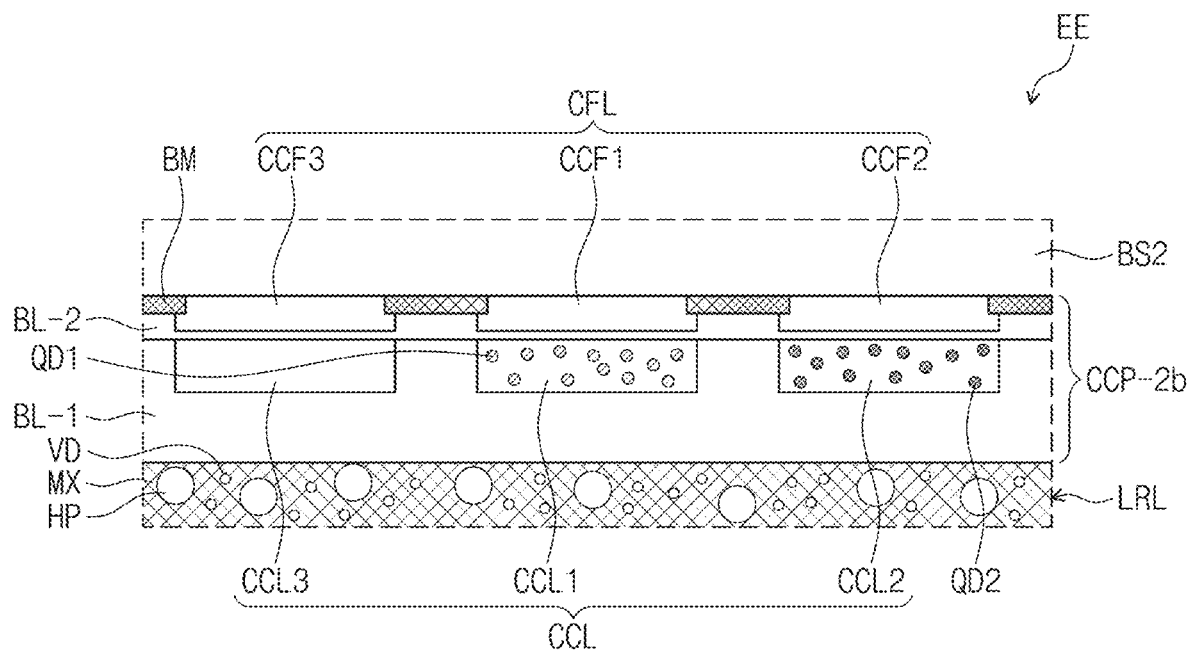
FIG. 17 is a cross-sectional view illustrating area EE of FIG. 15 according to an exemplary embodiment of the inventive concept.

FIG. 13 is a view illustrating an example of the display member provided in the electronic device DD (see FIG. 1) according to an exemplary embodiment of the inventive concept. FIG. 14 is a cross-sectional view taken along line III-III' of FIG. 13. FIG. 15 is a cross-sectional view illustrating area EE of FIG. 14. FIGS. 16 and 17 are cross-sectional views illustrating area EE of FIG. 15 according to exemplary embodiments of the inventive concept.

The display member DP-2 according to an exemplary embodiment may include a light source member LP-2, a low-refractive index layer LRL disposed on the light source member LP-2, and a color conversion member CCP-2 disposed on the low-refractive index layer LRL. The display member DP-2 may include an electroluminescent display element.

In the display member DP-2 according to an exemplary embodiment, the light source member LP-2 may include an organic electroluminescent element OEL. The light source member LP-2 may include a first base substrate BS1, a circuit layer CL-2, and an encapsulation member TFE.

The first base substrate BS1 may provide a base surface on which the organic electroluminescent element OEL is disposed. The first base substrate BS1 may be, for example, a glass substrate, a metal substrate, or a plastic substrate. However, the inventive concept is not limited thereto. For example, in an exemplary embodiment, the first base substrate BS1 may be an inorganic layer, an organic layer, or a composite layer.

The circuit layer CL-2 may be disposed on the first base substrate BS1, and the circuit layer CL-2 may include a plurality of transistors. The transistors may include a control electrode, an input electrode, and an output electrode, respectively. For example, the circuit layer CL-2 may include a switching transistor and a driving transistor, which are configured to drive the organic electroluminescent element OEL.

The organic electroluminescent element OEL may be disposed on the circuit layer CL-2. The organic electroluminescence element OEL may include a first electrode EL1, a second electrode EL2, and a plurality of organic layers disposed between the first electrode EL1 and the second electrode EL2. The organic electroluminescent element OEL may include a hole transfer region HTR disposed between the first electrode EL1 and the second electrode EL2, a light emitting layer EML, and an electron transfer region ETR.

The organic electroluminescent element OEL may emit the first light. For example, the organic electroluminescent element OEL may emit blue light.

Referring to FIG. 14, in the display member DP-2 according to an exemplary embodiment, the light emitting layer EML of the organic electroluminescent element OEL may be provided as a common layer on the first base substrate BS1. However, the inventive concept is not limited thereto. For example, in an exemplary embodiment, the light emitting layer EML may be patterned. For example, the light emitting layer EML may be patterned by being separated from a pixel defining layer PDL. The light emitting layer EML may be patterned to correspond to each of the first to third color conversion parts CCL1, CCL2, and CCL3.

The organic electroluminescent element OEL may be disposed on the encapsulation member TFE, and the encapsulation member TFE may be disposed on the second electrode EL2. The encapsulation member TFE may be directly disposed on the second electrode EL2. The encapsulation member TFE may be provided as a single layer or a laminate in which a plurality of layers are laminated. The encapsulation member TFE may be, for example, a thin film encapsulation layer. The encapsulation member TFE protects the organic electroluminescent element OEL. The encapsulation member TFE may cover the organic electroluminescent element OEL. The organic electroluminescent element OEL may be sealed by the encapsulation member TFE.

The encapsulation member TFE may include at least one organic layer and at least one inorganic layer. In the encapsulation member TFE, the at least one inorganic layer and the at least one organic layer may be alternately disposed. For example, the encapsulation member TFE may include an organic layer disposed between the two inorganic layers. In the encapsulation member TFE, the inorganic layer may include an inorganic material such as, for example, aluminum oxide or silicon nitride, and the organic layer may include an acrylate-base organic material.

The color conversion member CCP-2 may be disposed on the light source member LP-2 including the organic electroluminescent element OEL. The low-refractive index layer LRL may be disposed between the light source member LP-2 and the color conversion member CCP-2. The low-refractive index layer LRL described with reference to FIGS. 3 to 5C according to an exemplary embodiment described above may be equally applied to the low-refractive index layer LRL. For example, the low-refractive index layer LRL may include the matrix part MX (see FIG. 3), the plurality of hollow inorganic particles HP (see FIG. 3) dispersed in the matrix part MX (see FIG. 3), and the void parts VD (see FIG. 3) defined by the matrix part MX (see FIG. 3). The void parts VD of the low-refractive index layer LRL may be made of a pore induction material PG.

In the display member DP-2 according to an exemplary embodiment, the low-refractive index layer LRL may be disposed below the color conversion member CCP-2 to convert a traveling direction of light emitted from the color conversion member CCP-2 to a lower side of the display member DP-2. For example, the low-refractive index layer LRL may be disposed below the color conversion member CCP-2 to perform a light extraction function of reflecting the light emitted from the color conversion layer CCP-2 again to allow the light to travel to an upper side of the display member DP-2. Thus, the display member DP-2 according to an exemplary embodiment may have improved durability and light efficiency.

However, the inventive concept is not limited thereto. For example, in an exemplary embodiment, the low-refractive index layer LRL may be disposed above the color conversion member CCP-2.

In the display member DP-2 according to an exemplary embodiment, the color conversion member CCP-2 may include a plurality of color conversion parts CCL1, CCL2, and CCL3 that are spaced apart from each other on the plane. The color conversion member CCP-2 may further include a light blocking part BM disposed between the color conversion parts CCL1, CCL2, and CCL3. In the display member DP-2 according to an exemplary embodiment, the light blocking part BM may be disposed to correspond to the pixel defining layer PDL. For example, the light blocking part BM may be disposed in locations corresponding to the locations in which the pixel defining layer PDL are disposed.

The color conversion member CCP-2 may include a color conversion layer CCL including a plurality of color conversion parts CCL1, CCL2, and CCL3. The descriptions of the color conversion parts CCL1, CCL2, and CCL3, the light blocking part BM, and the conversion materials QD1 and QD2, which are provided in the display members DP and DP-1 described with reference to FIGS. 1 to 12 according to an exemplary embodiment described above may be equally applied to the color conversion parts CCL1, CCL2, and CCL3 and the light blocking part BM described herein. For example, the color conversion member CCP-2 may include a first conversion material QD1 that absorbs the first light to wavelength-convert the first light into second light, and a second conversion material QD2 that absorbs the first light to wavelength-convert the first light into third light. The color conversion member CCP-2 may include a first color conversion part CCL1 including the first conversion material QD1, a second color conversion part CCL2 including the second conversion material QD2, and a third color conversion part CCL3 that transmits the first color light.

A barrier layer BL may further be disposed between the low-refractive index layer LRL and the color conversion member CCP-2. The barrier layer BL may be disposed on at least one of upper and lower portions of the color conversion layer CCL provided in the color conversion member CCP-2 to prevent the color conversion layer CCL from being exposed to moisture/oxygen. The barrier layer BL may cover the color conversion layer CCL. The description of the barrier layer BL of the display member DP described with reference to FIGS. 6 and 7 according to an exemplary embodiment described above may be equally applied to the barrier layer BL. For example, the barrier layer BL may include at least one inorganic layer. The color conversion layer CCL may be directly disposed on the low-refractive index layer LRL. In this case, the barrier layer BL may be omitted on a bottom surface of the color conversion layer CCL.

The display member DP-2 according to an exemplary embodiment may include a second base substrate BS2. The second base substrate BS2 may be a member providing a base surface which faces the first base substrate BS1 and on which the color conversion member CCP-2 is disposed. The second base substrate BS2 may be, for example, a glass substrate, a metal substrate, or a plastic substrate. However, the inventive concept is not limited thereto. For example, in an exemplary embodiment, the second base substrate BS2 may be an inorganic layer, an organic layer, or a composite layer.

FIG. 16 is a cross-sectional view illustrating an example of a portion of the display member DP-2 of FIG. 13 according to an exemplary embodiment. For example, FIG. 16 is a cross-sectional view illustrating area EE of FIG. 15 according to an exemplary embodiment.

Referring to FIG. 16, a color conversion member CCP-2a according to an exemplary embodiment may be disposed on the low-refractive index layer LRL and include a plurality of color conversion parts CCL1, CCL2, and CCL3 and an optical filter layer FP. The color conversion member CCP-2a may further include a light blocking part BM disposed between the color conversion parts CCL1, CCL2, and CCL3 and a dam part DM. The dam part DM may be disposed to overlap the light blocking part BM and be disposed between the color conversion parts CCL1, CCL2, and CCL3.

The dam part DM may be made of, for example, a polymer resin. For example, the dam part DM may be formed by patterning an acrylic-based resin, an imide-based resin, etc. The dam part DM may be patterned, and a space between the dam parts DM may be filled with the color conversion parts CCL1, CCL2, and CCL3. For example, the dam part DM may partition the color conversion parts CCL1, CCL2, and CCL3, which are adjacent to each other, from each other.

The optical filter layer FP may be disposed on the first color conversion part CCL1 and the second color conversion part CCL2. The optical filter layer FP may block first light and transmit second and third light. For example, the optical filter layer FP may block blue light and transmit green light or red light. In an exemplary embodiment, the optical filter layer FP is disposed on the first and second color conversion parts CCL1 and CCL2 and is not disposed on the third color conversion part CCL3.

In the exemplary embodiment of FIG. 16, the optical filter layer FP may be integrally provided on the first and second color conversion parts CCL1 and CCL2 compared to the optical filter layers FP1 and FP2 provided in the color conversion member CCP-1 described with reference to FIGS. 11 and 12 according to an exemplary embodiment. The optical filter layer FP may be disposed to overlap the first color conversion part CCL1, the second color conversion part CCL2, and the light blocking part disposed BM adjacent to the color conversion parts. However, the inventive concept is not limited thereto. For example, in an exemplary embodiment, parts of the optical filter layer FP may be disposed to be spaced apart from each other on the plane to correspond to each of the first color conversion part CCL1 and the second color conversion part CCL2.

In the exemplary embodiment of FIG. 16, a reflection layer RP may be disposed between the low-refractive index layer LRL and the color conversion member CCP-2a. The description of the reflection layer RP provided in the display member DP-1 described with reference to FIGS. 8 to 12 may be equally applied to the reflection layer RP described herein. For example, the reflection layer RP disposed below the color conversion member CCP-2a according to an exemplary embodiment may transmit the first light provided from the light source member LP-2 and reflect the second light and the third light. The reflection layer RP may be a selective transmission-reflection layer. Unlike the exemplary embodiment illustrated in FIG. 16, in an exemplary embodiment, the low-refractive index layer LRL may be directly disposed on a lower portion of each of the color conversion parts CCL1, CCL2, and CCL3. For example, the low-refractive index layer LRL may be disposed between the reflection layer RP and the color conversion parts CCL1, CCL2, and CCL3.

FIG. 17 is a cross-sectional view illustrating an example of a portion of the display member DP-2 of FIG. 13 according to an exemplary embodiment. For example, FIG. 17 is a cross-sectional view illustrating area EE of FIG. 15 according to an exemplary embodiment.

Referring to FIG. 17, the color conversion member CCP-2b according to an exemplary embodiment may be disposed on the low-refractive index layer LRL, and may include a color conversion layer CCL including the plurality of color conversion parts CCL1, CCL2, and CCL3 and a color filter layer CFL disposed on the color conversion layer CCL.

The color filter layer CFL may include a first filter part CCF1 overlapping the first color conversion part CCL1, a second filter part CCF2 overlapping the second color conversion part CCL2, and a third filter part CCF3 overlapping the third color conversion part CCL3.

The color filter layer CFL may prevent reflection due to external light from occurring. In the color filter layer CFL, the first filter part CCF1 may be provided as a green filter, the second filter part CCF2 may be provided as a red filter, and the third filter part CCF3 may be provided as a blue filter. The first filter part CCF1 provided as a green filter, the second filter part CCF2 provided as a red filter, and the third filter part CCF3 provided as a blue filter may transmit light provided from the first color conversion part CCL1, the second color conversion part CCL2, and third color conversion part CCL3, and block light except for the light provided from the corresponding color conversion parts, respectively.

In the exemplary embodiment of FIG. 17, the color conversion member CCP-2b may further include barrier layers BL-1 and BL-2 respectively disposed above and below the color conversion parts CCL1, CCL2, and CCL3. The barrier layers BL-1 and BL-2 may protect the color conversion parts CCL1, CCL2, and CCL3. The description of the barrier layers BL-1 and BL-2 of the display member DP described with reference to FIGS. 6 and 7 according to an exemplary embodiment may be equally applied to the barrier layer BL. For example, each of the barrier layers BL-1 and BL-2 may include at least one inorganic layer.

The first barrier layer BL1 may be disposed between the low-refractive index layer LRL and the color conversion parts CCL1, CCL2, and CCL3, and the second barrier layer BL2 may be disposed between the color conversion parts CCL1, CCL2, and CCL3 and the color filter layer CFL. At least one of the first barrier layer BL1 and the second barrier layer BL2 may be omitted.

Although the low-refractive index layer LRL is disposed below color conversion members CCP-2, CCP-2a, and CCP-2b in the electronic device and the display member DP-2 described with reference to FIGS. 13 to 17, the inventive concept is not limited thereto. For example, in an exemplary embodiment, the low-refractive index layer LRL may be disposed above the color conversion members CCP-2, CCP-2a, and CCP-2b. The low-refractive index layer LRL may be disposed above the color conversion parts CCL1, CCL2, and CCL3 to improve efficiency of the light emitted to the outside.

In the electronic device and the display member DP-2 described with reference to FIGS. 13 to 17 according to an exemplary embodiment, the low-refractive index layer LRL, which is improved in strength, may be provided to improve durability of the electronic device and the display member DP-2. The low-refractive index layer LRL may be disposed above or below the color conversion members CCP-2, CCP-2a, and CCP-2b to improve light extraction efficiency. For example, the electronic device DS (see FIG. 1) including the display member DP-2 according to an exemplary embodiment may have improved durability and reliability and also have superior optical efficiency.

Figure 18A:
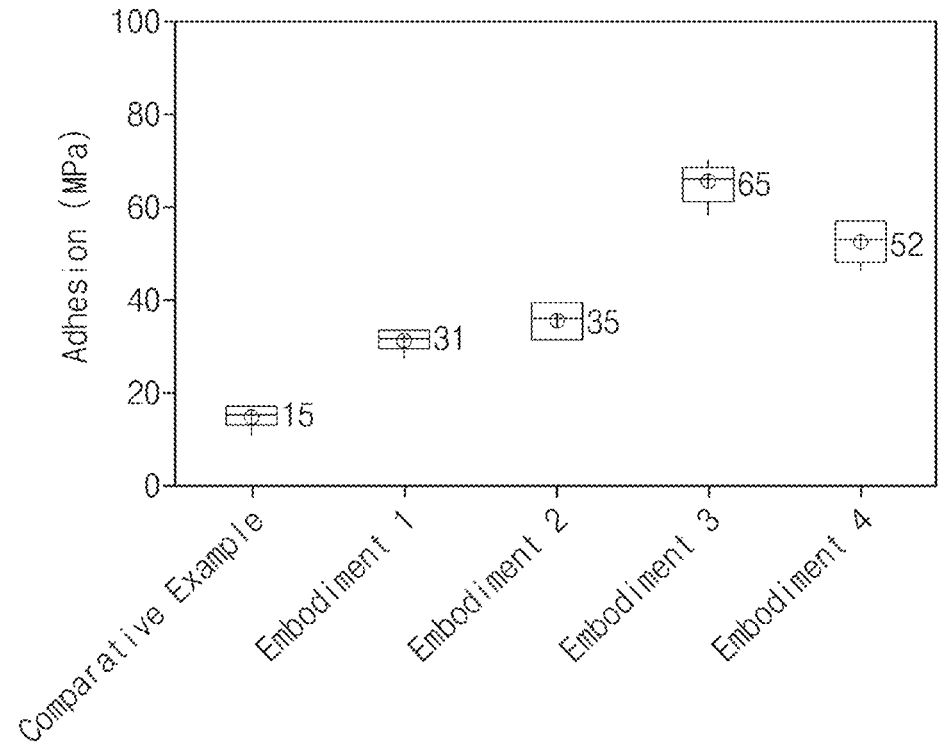
FIG. 18A is a graph illustrating results obtained by evaluating durability of a low-refractive index layer according to a comparative example and exemplary embodiments of the inventive concept.
Figure 18B:
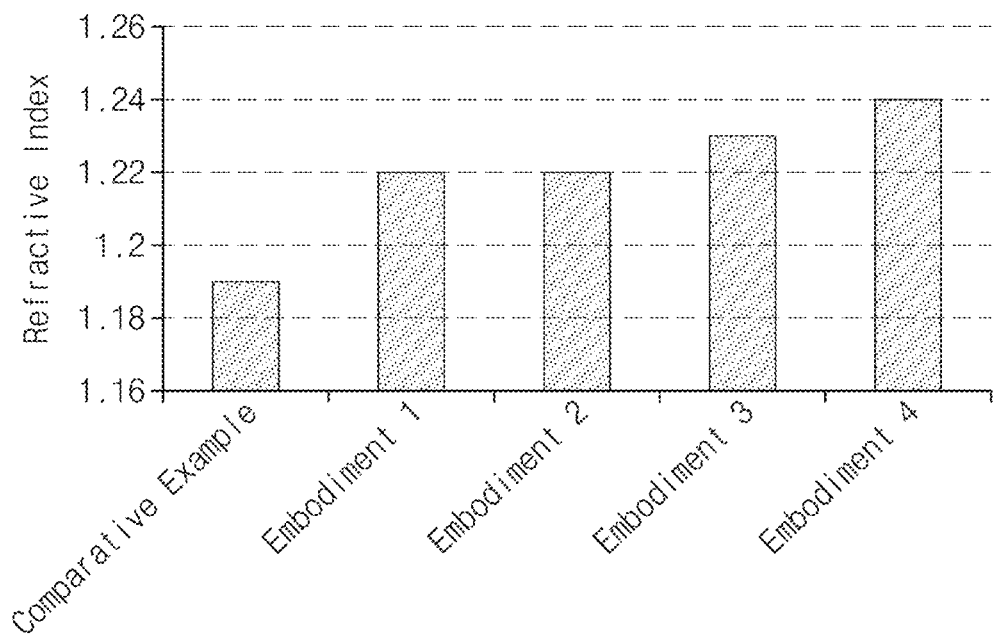
FIG. 18B is a graph illustrating results obtained by measuring a refractive index value of a low-refractive index layer according to a comparative example and exemplary embodiments of the inventive concept.

FIG. 18A is a graph illustrating results obtained by evaluating durability of a low-refractive index layer according to a comparative example and exemplary embodiments of the inventive concept. FIG. 18B is a graph illustrating results obtained by measuring a refractive index value of a low-refractive index layer according to the comparative example and the exemplary embodiments of the inventive concept.

Table 1 below shows the content of each of a hollow inorganic particle and a pore induction material, and a content ratio of the pore induction material in a low-refractive index layer used in a comparative example and exemplary embodiments, which are used for an adhesion test of FIG. 18A and a refractive index measurement of FIG. 18B. In Table 1, the content ratio of the pore induction material means a ratio of a weight of the pore induction material on the basis of the total weight of the hollow inorganic particles and the pore induction material.

TABLE 1

| Classification | Content (%) of Hollow Inorganic Particle | Content (%) of Pore Induction Material | Content Ratio (%) of Pore Induction Material |
| --- | --- | --- | --- |
| Comparative Example | 0 | 40 | 100 |
| Embodiment 1 | 33 | 17 | 34 |
| Embodiment 2 | 38 | 14 | 27 |
| Embodiment 3 | 38 | 12 | 24 |
| Embodiment 4 | 40 | 10 | 20 |

Referring to Table 1, the low-refractive index layer according to the comparative example was prepared by containing about 40 wt % of the pore induction material without containing the hollow inorganic particles when a polymer resin for forming the matrix part is 100. Embodiment 1 corresponds to a case in which the hollow inorganic particles are included in an amount of about 33 wt %, and the pore induction material is included in an amount of about 17 wt % when the polymer resin for forming the matrix par is 100 during the formation of the low-refractive index layer. Embodiment 2 corresponds to a low-refractive index layer formed by containing about 38 wt % of the hollow inorganic particles and about 14 wt % of the pore induction material on the basis of 100 of the polymer resin. Embodiment 3 corresponds to a low refractive layer formed by containing about 38 wt % of the hollow inorganic particles and about 12 wt % of the pore induction material on the basis of 100 of the polymer resin. Embodiment 4 corresponds to a low refractive layer formed by containing about 40 wt % of the hollow inorganic particles and about 10 wt % of the pore induction material on the basis of 100 of the polymer resin.

FIG. 18A illustrates results obtained by testing strength when using the low-refractive index layers according to the comparative example and exemplary embodiments. Here, an adhesion value shown in the graph of FIG. 18A is measured through a stud pull test. A sample used in the test was a laminate in which a glass substrate/a low-refractive index layer/a siloxane inorganic layer are laminated. In the sample, the low-refractive index layer was prepared from the contents of the hollow inorganic particles and the hollow induction material according to the comparative example and exemplary embodiments, which are shown in Table 1. The strength of the low-refractive index layer according to the comparative example and exemplary embodiments were relatively compared through the stud pull test of FIG. 18A.

Referring to the results of FIG. 18A, a higher adhesion value was shown in the exemplary embodiments when compared to the comparative example. In the comparative example, a mean value of the adhesion was about 15 MPa, and in the exemplary embodiments 1 to 4, the adhesion value was twice or more when compared to that according to the comparative example. It can be seen that the low-refractive index layer provided in the electronic device according to an exemplary embodiment has superior strength from the results of the adhesion value according to the comparative example and exemplary embodiments. For example, it can be seen that the low-refractive index layers including the void parts made of the pore induction material and the hollow inorganic particles, according to exemplary embodiments, are improved in strength when compared to that according to the comparative example, which does not include the hollow inorganic particles. Referring to FIG. 18A, it can be seen that the low-refractive index layer according to an exemplary embodiment is improved in strength by including the pore induction material at a content ratio of about 5% to about 35%.

The total content ratio of the hollow inorganic particles and the pore induction material with respect to the polymer resin may be about 40% to about 60% with respect to the total content ratio, e.g., 100 of the polymer resin, the hollow inorganic particles, and the pore induction material, which form the low-refractive index layer. For example, in the manufacturing of the low-refractive index layer, when the content of the polymer resin is about 40% or less (when the total content ratio of the hollow inorganic particles and the pore induction material is about 60% or more), the content of the polymer resin forming the matrix part of the low-refractive index layer may be relatively less to cause contraction of the matrix part. Thus, a void part may be generated due to the contraction of the matrix part in addition to the void part made of the pore induction material, which may deteriorate the strength of the low-refractive index layer. In the manufacturing of the low-refractive index layer, the content of the polymer resin exceeds about 60% (when the total content ratio of the hollow inorganic particles and the pore induction material is about 40% or less), the content of the hollow inorganic particles and the pore induction material, which are included in the low-refractive index layer, may be relatively less, and thus, it may be difficult to maintain the low reflective index valve.

Referring again to FIG. 18A, in the exemplary embodiments 3 and 4, it can be seen that the adhesion value is as high as about 50 MPa or more. Thus, it can be seen that the low-refractive index layer according to an exemplary embodiment is improved in strength when compared to a case in which the pore induction material is included at a ratio of about 25% or less. For example, according to an exemplary embodiment, the low-refractive index layer may include the hollow inorganic particles and the void parts formed from the void induction material, as described above. In the manufacturing of the low-refractive index layer, a content ratio of the void induction material may be about 15% to about 25%, which may further improve the durability of the electronic device.

FIG. 18B illustrates a refractive index value of the low-refractive index layer formed at the contents of the hollow inorganic particles and the pore induction material, which are proposed in the comparative example and the exemplary embodiments shown in Table 1. Referring to FIG. 18B, it can be seen that the low-refractive index layer according to the exemplary embodiments 1 to 4 has a refractive index valve of about 1.20 to about 1.25.

Thus, referring to FIGS. 18A and 18B, when compared to a comparative example, in exemplary embodiments (e.g. the exemplary embodiments 1 to 4), the low-refractive index layer is formed so that the content of the pore induction material is reduced, and the hollow inorganic particles are further included. Thus, it can be seen that the high adhesion value is maintained while maintaining the low refractive index value. For example, when compared to the comparative example, it can be seen that the strength characteristics are improved in exemplary embodiments while maintaining the low-refractive index characteristic of about 1.25 at a content ratio of about 5% to about 35% of the pore induction material.

Figure 19A:
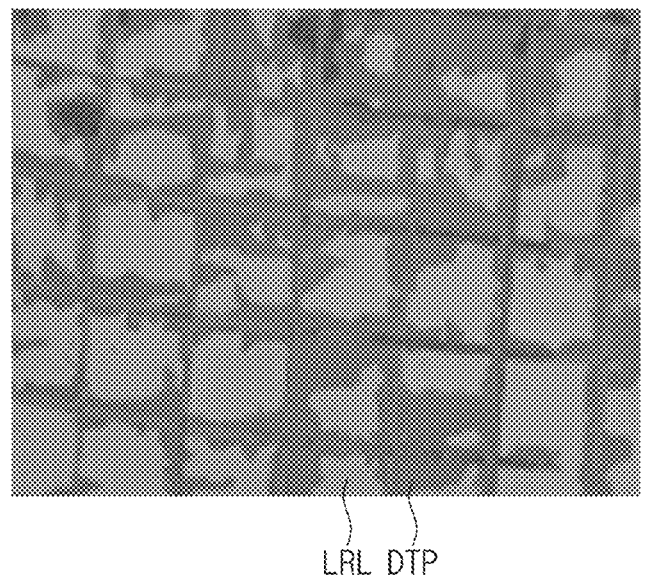
FIGS. 19A and 19B are images illustrating the results obtained by evaluating the durability of the low-refractive index layer according to a comparative example and an exemplary embodiment of the inventive concept.
Figure 19B:
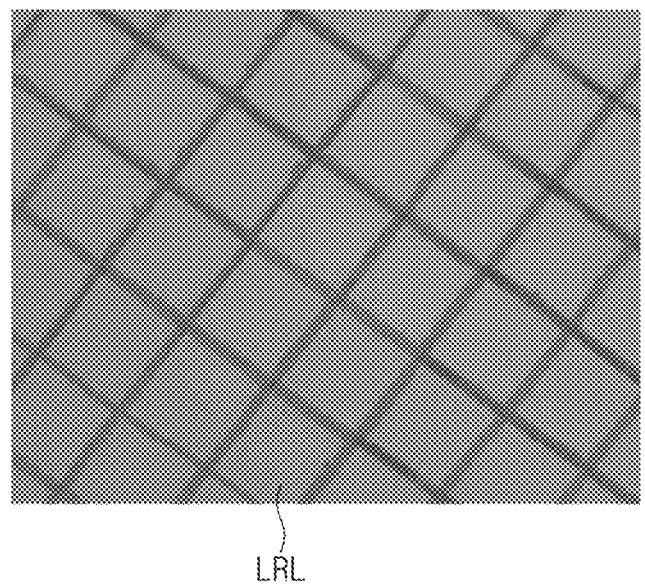

FIGS. 19A and 19B are images illustrating the results obtained by evaluating the durability of the low-refractive index layer according to the comparative example and the exemplary embodiment 3 in Table 1. FIGS. 19A and 19B illustrate results of a tape test for the low-refractive index layer in the comparative example and the exemplary embodiment 3, respectively. The comparative example corresponds to a case in which the low-refractive index layer including the matrix part and the void parts but not including the hollow inorganic particles is used, and the exemplary embodiment 3 corresponds to a case in which the low-refractive index layer including all of the matrix part, the void parts, and the hollow inorganic particles is used.

In the tape test, the low-refractive index layers according to the comparative example and the exemplary embodiment 3 is formed on a glass substrate as a base material and is cross-hatched and cut, and then, an adhesive tape adheres onto the cross-hatched and cut low-refractive index layer to compare the states of the remaining low-refractive index layers.

FIG. 19A is an image illustrating a surface of the low-refractive index layer including the matrix part and the void parts according to the comparative example after the tape test. In FIG. 19A, a relatively dark portion corresponds to a portion DTP at which the low-refractive index layer is delaminated, and a relatively bright portion corresponds to the low-refractive index layer remaining after the tape test. When comparing FIGS. 19A and 19B, it can be seen that the delaminated portion DTP appears at various portions in the comparative example, and the low-refractive index layer LRL in the exemplary embodiment 3 is not delaminated and is maintained after the tape test. The comparative example showing the results in FIG. 19A represents a level 1B in the tape test, and the exemplary embodiment 3 showing the results in FIG. 19B represents a level 5B in the tape test. In the tape test, the level 1B corresponds to a case in which more than about 65% of the cross-hatched and cut portion is removed, and the level 5B corresponds to a case in which the cross-hatched and cut portion is not removed through the tape test.

Thus, referring to the results in FIGS. 19A and 19B, in the case of the low-refractive index layer according to exemplary embodiments in which the content of the void parts is relatively reduced, and the hollow inorganic particles are further included, it can be seen that the adhesion and the internal strength are improved when compared to the case in which the hollow inorganic particles are not included according to the comparative example.

Figure 20A:
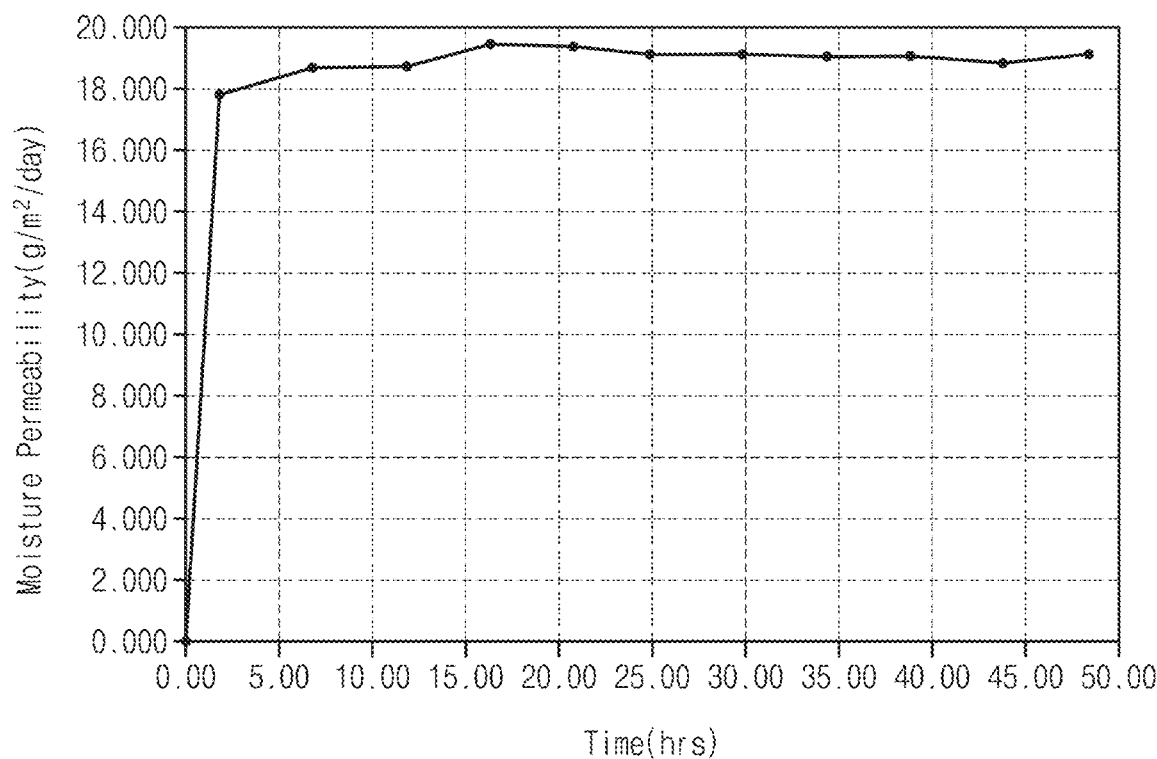
FIGS. 20A and 20B are graphs illustrating results obtained by evaluating moisture permeability of the low-refractive index layer according to a comparative example and an exemplary embodiment of the inventive concept, respectively.
Figure 20B:
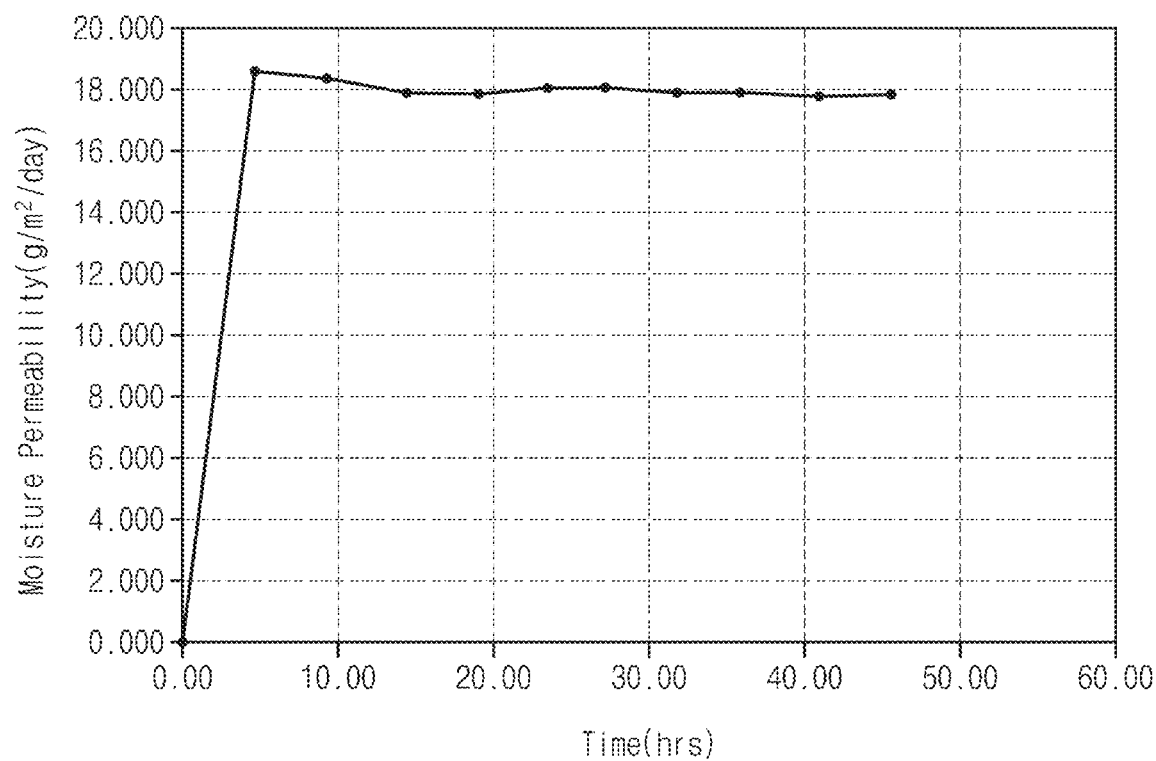

FIGS. 20A and 20B are graphs illustrating results obtained by evaluating moisture permeability of the low-refractive index layer according to a comparative example and the exemplary embodiment 3, respectively. In the case of the comparative example, the moisture permeability ($g/m^2$/day) was about 19.1, and in the case of the exemplary embodiment 3, the moisture permeability ($g/m^2$/day) was about 17.7. For example, in the case of the exemplary embodiment 3, when compared to the comparative example, it can be seen that a specific gravity of the void parts relatively decreases to reduce the moisture permeability. For example, referring to the results in FIGS. 20A and 20B, in the case of the exemplary embodiment 3 in which the content of the void parts is relatively reduced, and the hollow inorganic particles are further included, it can be seen that reliability is improved.

Also, the low-refractive index layers of the comparative example and the exemplary embodiment 3 were subjected to a reliability test under high temperature and high humidity conditions. In the case of the exemplary embodiment 3 under 85° C./85% conditions, discoloration and stain did not occur.

Table 2 below shows the durability and reliability evaluation results according to the comparative example and the exemplary embodiment 3.

TABLE 2

| Classification | Comparative Example | Embodiment 3 |
| --- | --- | --- |
| Adhesion (MPa) | 15 MPa | 65 MPa |
| Tape Test | 1B | 5B |
| Moisture Permeability (g/m²/day) | 19.1 g/m²/day | 17.7 g/m²/day |
| WHTS (85° C./85%) | Discoloration and Stain Occurrence | Discoloration and Stain Non-occurrence |

The electronic device according to an exemplary embodiment may have superior light efficiency and improved durability as a result of including the low-refractive index layer, which includes the hollow inorganic particles and the void parts, and has improved internal strength while still having a good low-refractive index value.

For example, the electronic device according to an exemplary embodiment may include the low-refractive index layer, which may be optimized at a ratio of the void parts of the pore induction material and the hollow inorganic particles, in the display member to realize improved light efficiency and durability.

The electronic device according to an exemplary embodiment may include the low-refractive index layer, which includes both the hollow inorganic particles and the void parts, to realize improved reliability while maintaining the low reflection index.

The electronic device according to an exemplary embodiment may include the low-refractive index layer having a good refractive index and high strength, which may improve the light efficiency and color reproducibility, thereby improving the display quality.

While the inventive concept has been particularly shown and described with reference to the exemplary embodiments thereof, it will be understood by those of ordinary skill in the art that various changes in form and detail may be made therein without departing from the spirit and scope of the inventive concept as defined by the following claims.

What is claimed is:

1. An electronic device, comprising:
    a light source member configured to provide a first light;
    a color conversion member disposed on the light source member and comprising a first conversion material that converts the first light into a second light and a second conversion material that converts the first light into a third light; and
    a low-refractive index layer disposed on the light source member and disposed on at least one of upper and lower portions of the color conversion member,
    wherein the low-refractive index layer comprises a matrix part, a plurality of hollow inorganic particles dispersed in the matrix part, and a plurality of second voids defined by the matrix part,
    wherein the plurality of hollow inorganic particles comprises a plurality of first voids and each first void is surrounded by a shell part,
    wherein the first voids are unconnected from one another and the second voids are unconnected from one another, a total volume of the unconnected first voids is greater than a total volume of the unconnected second voids, and each second void is not surrounded by the shell part.

2. The electronic device of claim 1, wherein each of the hollow inorganic particles comprises a core part filled with air and the shell part surrounding the core part.

3. The electronic device of claim 2, wherein the shell part comprises at least one of $SiO_2$, $MgF_2$, or $Fe_3O_4$.

4. The electronic device of claim 1, wherein the second voids have sphere shapes and a mean diameter of about 1 nm to about 5 nm.

5. The electronic device of claim 1, wherein the hollow inorganic particles have sphere shapes and a mean diameter of about 20 nm to about 200 nm.

6. The electronic device of claim 1, wherein the matrix part comprises at least one of an acrylic-based polymer, a silicone-based polymer, a urethane-based polymer, or an imide-based polymer.

7. The electronic device of claim 1, wherein the low-refractive index layer has a transmittance of about 95% or more in a wavelength of about 400 nm to about 700 nm, and a refractive index of about 1.1 to about 1.5 in a wavelength of about 632 nm.

8. The electronic device of claim 1, wherein the first light is a blue light, the first conversion material is a first quantum dot that converts the blue light into a green light, and the second conversion material is a second quantum dot that converts the blue light into a red light.

9. The electronic device of claim 1, further comprising:
    a display element disposed on the color conversion member.

10. The electronic device of claim 9, wherein the display element comprises a liquid crystal element.

11. The electronic device of claim 9, wherein the light source member comprises:
    a guide panel; and
    a light source disposed at one side of the guide panel,
    wherein the low-refractive index layer is disposed between the guide panel and the color conversion member.

12. The electronic device of claim 11, wherein the low-refractive index layer is directly disposed on the guide panel.

13. The electronic device of claim 11, further comprising:
    a barrier layer disposed on at least one of top and bottom surfaces of the color conversion member.

14. The electronic device of claim 1, wherein the color conversion member comprises a plurality of color conversion parts that are spaced apart from each other on a plane, wherein the color conversion parts comprise:
    a first color conversion part comprising the first conversion material;
    a second color conversion part comprising the second conversion material; and
    a third color conversion part configured to transmit the first light.

15. The electronic device of claim 14, wherein the color conversion member further comprises a light blocking part disposed between the first to third color conversion parts spaced apart from each other.

16. The electronic device of claim 14, further comprising:
    a reflection layer disposed on at least one of upper and lower portions of the color conversion parts,
    wherein the reflection layer transmits the first light and reflects the second and third light.

17. The electronic device of claim 16, wherein the low-refractive index layer is disposed between the reflection layer and the color conversion parts and covers the color conversion parts.

18. The electronic device of claim 16, wherein the reflection layer is disposed between the low-refractive index layer and the color conversion parts and covers the color conversion parts.

19. The electronic device of claim 14, wherein the color conversion member further comprises a barrier layer disposed on at least one of upper and lower portions of the color conversion parts.

20. The electronic device of claim 19, wherein the barrier layer is disposed between the low-refractive index layer and the color conversion parts and covers the color conversion parts.

21. The electronic device of claim 14, wherein the color conversion member further comprises an optical filter layer configured to transmit at least one of the second and third light.

22. The electronic device of claim 21, wherein the optical filter layer comprises:
a first optical filter layer disposed on the first color conversion part; and
a second optical filter layer disposed on the second color conversion part.

23. The electronic device of claim 22, wherein the first optical filter layer transmits a green light, and the second optical filter layer transmits a red light.

24. The electronic device of claim 14, further comprising:
a first base substrate disposed on the light source member;
a second base substrate disposed on the light source member and facing the first base substrate; and
a liquid crystal layer disposed on the light source member between the first and second base substrates,
wherein the color conversion member is disposed between the liquid crystal layer and the second base substrate.

25. The electronic device of claim 24, wherein the low-refractive index layer is disposed between the liquid crystal layer and the color conversion member or between the color conversion member and the second base substrate.

26. The electronic device of claim 24, further comprising:
a first polarizing layer disposed between the light source member and the first base substrate or between the first base substrate and the liquid crystal layer; and
a second polarizing layer disposed between the liquid crystal layer and the second base substrate.

27. The electronic device of claim 14, wherein the light source member comprises an organic electroluminescent element.

28. The electronic device of claim 27, wherein the color conversion member further comprises a dam part that partitions the color conversion parts from each other and is disposed between adjacent color conversion parts of the color conversion parts.

29. The electronic device of claim 27, wherein the color conversion member further comprises a color filter layer disposed on the color conversion parts, and the color filter layer comprises:
a plurality of filter parts configured to emit light having various colors; and
a light blocking part configured to partition the filter parts from each other and disposed between adjacent filter parts of the filter parts.

30. An electronic device, comprising:
a light source member configured to provide a first light;
a color conversion member disposed on the light source member and comprising a first conversion material that converts the first light into a second light and a second conversion material that converts the first light into a third light; and
a low-refractive index layer disposed on the light source member and disposed on at least one of upper and lower portions of the color conversion member,
wherein the low-refractive index layer comprises a matrix part, a plurality of hollow inorganic particles dispersed in the matrix part and comprising a plurality of first voids, and a plurality of second voids defined by the matrix part,
wherein a mean diameter of the first voids is greater than a mean diameter of the second voids,
wherein the first voids are unconnected from one another and the second voids are unconnected from one another, each first void is surrounded by a shell part, and each second void is not surrounded by the shell part.

31. An electronic device, comprising:
a display element;
a guide panel disposed below the display element;
a light source member disposed adjacent to at least one surface of the guide panel;
a color conversion member disposed between the guide panel and the display element; and
a low-refractive index layer disposed between the guide panel and the color conversion member,
wherein the low-refractive index layer comprises a matrix part, a plurality of hollow inorganic particles dispersed in the matrix part, and a plurality of second voids defined by the matrix part,
wherein the plurality of hollow inorganic particles comprises a plurality of first voids, and each first void is surrounded by a shell part,
wherein the first voids are unconnected from one another and the second voids are unconnected from one another, a total volume of the unconnected first voids is greater than a total volume of the unconnected second voids, and each second void is not surrounded by the shell part.

32. The electronic device of claim 31, wherein the light source member comprises a light emitting element configured to emit a blue light, and
the color conversion member comprises a green quantum dot excited by the blue light to emit a green light, and a red quantum dot excited by at least one of the blue light and the green light to emit a red light.

33. The electronic device of claim 31, wherein each of the hollow inorganic particles comprises a core part filled with air and the shell part defining the core part, and
a mean diameter of the core parts is greater than a mean diameter of the second voids.

* * * * *